US011415630B2

(12) United States Patent
Dubarry et al.

(10) Patent No.: US 11,415,630 B2
(45) Date of Patent: Aug. 16, 2022

(54) METHODS AND APPARATUS FOR UPDATING A FUEL GAUGE AND ESTIMATING STATE OF HEALTH OF AN ENERGY STORAGE CELL

(71) Applicant: University of Hawaii, Honolulu, HI (US)

(72) Inventors: Matthieu Dubarry, Honolulu, HI (US); Arnaud Devie, Honolulu, HI (US)

(73) Assignee: UNIVERSITY OF HAWAII, Honolulu, HI (US)

( * ) Notice: Subject to any disclaimer, the term of this patent is extended or adjusted under 35 U.S.C. 154(b) by 1255 days.

(21) Appl. No.: 15/444,163

(22) Filed: Feb. 27, 2017

(65) Prior Publication Data

US 2018/0321323 A1 Nov. 8, 2018

Related U.S. Application Data

(60) Provisional application No. 62/301,447, filed on Feb. 29, 2016.

(51) Int. Cl.
*G01R 31/367* (2019.01)
*G01R 31/392* (2019.01)
(Continued)

(52) U.S. Cl.
CPC ....... *G01R 31/367* (2019.01); *G01R 31/3835* (2019.01); *G01R 31/3842* (2019.01); *G01R 31/392* (2019.01)

(58) Field of Classification Search
CPC .................................................. G01R 31/367
See application file for complete search history.

(56) References Cited

U.S. PATENT DOCUMENTS 6,892,148 B2 5/2005 Barsoukov et al.
8,046,181 B2 10/2011 Kang et al.
(Continued)

FOREIGN PATENT DOCUMENTS

WO WO 2016/113481 7/2016

OTHER PUBLICATIONS

Bai, G., P. Wang, C. Hu, M. Pecht, "A generic model-free approach for lithium-ion battery health management," Applied Energy, vol. 135, 2014, pp. 247-260.
(Continued)

*Primary Examiner* — John E Breene
*Assistant Examiner* — Jeffrey C Morgan
(74) *Attorney, Agent, or Firm* — Knobbe Martens Olson & Bear, LLP

(57) ABSTRACT

In one aspect, an embodiment of this invention comprises an apparatus for updating an active fuel gauge of a battery cell. The apparatus comprises a memory, a sensor, and a processor. The memory stores data regarding an active fuel gauge of the battery cell based on a first voltage and state of charge (SOC) relationship. The processor receives first, second, and third resting voltage measurements at different times. The processor calculates differences in capacity between pairs of the resting voltage measurements based on the first voltage and state of charge (SOC) relationship. When the differences are equal the reference capacity difference, the processor identifies an estimate of a remaining capacity of the battery cell corresponding with the active fuel gauge. When the differences are not equal to the reference capacity difference, the processor updates the active fuel gauge based on an identified second voltage and SOC relationship.

21 Claims, 21 Drawing Sheets

(51) Int. Cl.
   *G01R 31/3842* (2019.01)
   *G01R 31/3835* (2019.01)

(56) References Cited

U.S. PATENT DOCUMENTS

| | | | |
|---|---|---|---|
| 9,081,068 | B2 | 7/2015 | Mattisson et al. |
| 2001/0009371 | A1* | 7/2001 | Podrazhansky .... G01R 31/3835 324/432 |
| 2007/0065713 | A1* | 3/2007 | Rauchfuss ....... G01R 19/16542 429/66 |
| 2011/0215761 | A1 | 9/2011 | Mingant et al. |
| 2012/0130690 | A1* | 5/2012 | Srivastava ............. G16C 20/30 703/2 |
| 2012/0290234 | A1* | 11/2012 | Schaefer ................. B60L 58/12 702/63 |
| 2013/0069660 | A1 | 3/2013 | Bernard et al. |
| 2014/0214347 | A1 | 7/2014 | Laskowsky et al. |
| 2014/0257724 | A1* | 9/2014 | Mattisson ............. H02J 7/0047 702/63 |
| 2015/0268309 | A1 | 9/2015 | Kim |

OTHER PUBLICATIONS

Berecibar, M., I. Gandiaga, I. Villarreal, N. Omar, J. Van Mierlo, P. Van den Bossche, "Critical review of state of health estimation methods of Li-ion batteries for real applications," Renewable and Sustainable Energy Reviews, vol. 56, 2016, pp. 572-587.

Bernardi, Dawn M. and Joo-Young Go, "Analysis of pulse and relaxation behavior in lithium-ion batteries," Journal of Power Sources, vol. 196, 2011, pp. 412-427.

Birkl, C.R., E. McTurk, M.R. Roberts, P.G. Bruce, and D.A. Howey, "A Parametric Open Circuit Voltage Model for Lithium Ion Batteries," Journal of the Electrochemical Society, vol. 162, 2015, pp. A2271-A2280.

Christophersen J.P., G.L. Hunt, C.D. Ho, D. Howell, "Pulse resistance effects due to charging or discharging of high-power lithium-ion cells: A path dependence study," Journal of Power Sources, vol. 173, 2007, pp. 998-1005.

Delacourt, C., M. Safari, "Life Simulation of a Graphite/LiFePO$_4$ Cell under Cycling and Storage," Journal of the Electrochemical Society, vol. 159, 2012, A1283-A1291.

Dubarry, M., C. Truchot, B.Y. Liaw, "Synthesize battery degradation modes via a diagnostic and prognostic model," Journal of Power Sources, vol. 219, 2012, pp. 204-216.

Dubarry, M., C. Truchot, B.Y. Liaw, "Cell degradation in commercial LiFePO$_4$ cells with high-power and high-energy designs," Journal of Power Sources, vol. 258, 2014, pp. 408-419.

Farkhondeh, M., C. Delacourt, "Mathematical Modeling of Commercial LiFePO$_4$ Electrodes Based on Variable Solid-State Diffusivity," Journal of The Electrochemical Society, vol. 159, 2012, A177-A192.

Gering, K.L., S.V. Sazhin, D.K. Jamison, C.J. Michelbacher, B.Y. Liaw, M. Dubarry, M. Cugnet, "Investigation of path dependence in commercial lithium-ion cells chosen for plug-in hybrid vehicle duty cycle protocols," Journal of Power Sources, vol. 196, 2011, pp. 3395-3403.

Klett, M., R. Eriksson, J. Groot, P. Svens, K. Ciosek Hogstrom, R.W. Lindstrom, H. Berg, T. Gustafson, G. Lindbergh, K. Edstrom, "Non-uniform aging of cycled commercial LiFePO$_4$//graphlte cylindrical cells revealed by post-mortem analysis," Journal of Power Sources, vol. 257, 2014, pp. 126-137.

Lavigne, L., J. Sabatier, J. Mbala Francisco, F. Guillemard, and A. Noury, "Lithium-ion Open Circuit Voltage (OCV) curve modelling and its ageing adjustment," Journal of Power Sources, vol. 324, 2016, pp. 694-703.

Liaw B.Y., M. Dubarry, "From driving cycle analysis to understanding battery performance in real-life electric hybrid vehicle operation," Journal of Power Sources, vol. 174, 2007, pp. 76-88.

Ma, Z., J. Jiang, W. Shi, W. Zhang, C.C. Mi, "Investigation of path dependence in commercial lithium-ion cells for pure electric bus applications: Aging mechanism identification," Journal of Power Sources, vol. 274, 2015, pp. 29-40.

Pattipati, B., B. Balasingam, G.V. Avvari, K.R. Pattipati, Y. Bar-Shalom, "Open circuit voltage characterization of lithium-ion batteries," Journal of Power Sources, vol. 269, 2014, pp. 317-333.

Pei, Lei, Tiansi Wang, Rengui Lu, and Chunbo Zhu, "Development of a voltage relaxation model for rapid open-circuit voltage prediction in lithium-ion batteries," Journal of Power Sources, vol. 253, 2014, pp. 412-418.

Schmidt, Jan Philipp, Hai Yen Tran, Jan Richter, Ellen Ivers-Tiffee, and Margret Wohlfahrt-Mehrens, "Analysis and prediction of the open circuit potential of lithium-ion cells," Journal of Power Sources, vol. 239, 2013, pp. 696-704.

Stiaszny, B., J.C. Ziegler, E.E. Krauß, J.P. Schmidt, E. Ivers-Tiffée, "Electrochemical characterization and post-mortem analysis of aged LiMn$_2$O$_4$—Li(Ni$_{0.5}$Mn$_{0.3}$Co$_{0.2}$)O$_2$/graphite lithium ion batteries. Part I: Cycle aging," Journal of Power Sources, vol. 251, 2014, pp. 439-450.

Stiaszny, B., J.C. Ziegler, E.E. Krauß, M. Zhang, J.P. Schmidt, E. Ivers-Tiffée, "Electrochemical characterization and post-mortem analysis of aged LiMn$_2$O$_4$—NMC/graphite lithium ion batteries part II: Calendar aging," Journal of Power Sources, vol. 258, 2014, pp. 61-75.

Tong, Shijie, Matthew P. Klein, and Jae Wan Park, "On-line optimization of battery open circuit voltage for improved state-of-charge and state-of-health estimation," Journal of Power Sources, vol. 293, 2015, pp. 416-428.

Waldmann, T., M. Wilka, M. Kasper, M. Fleischhammer, M. Wohlfahrt-Mehrens, "Temperature dependent ageing mechanisms in Lithium-ion batteries—A Post-Mortem study," Journal of Power Sources, vol. 262, 2014, pp. 129-135.

Waldmann, T., N. Ghanbari, M. Kasper, M. Wohlfahrt-Mehrens, "Correlations between Electrochemical Data and Results from Post-Mortem Analysis of Aged Lithium-Ion Batteries," Journal of The Electrochemical Society, vol. 162, 2015, A1500-A1505.

Wang, Tiansi, Lei Pei, Tingting Wang, Rengui Lu, and Chunbo Zhu, "Capacity-loss diagnostic and life-time prediction in lithium-ion batteries: Part 1. Development of a capacity-loss diagnostic method based on open-circuit voltage analysis," Journal of Power Sources, vol. 301, 2016, pp. 187-193.

Chaturvedi, N. A., Klein, R., Christrnsen, J., Ahmed, J., and Kojic, A., "Algorithms for Advanced Battery-Management Systems; Modeling, Estimation, and Control Challenges for Lithium-Ion Batteries" IEEE Control Systems Magazine, Jun. 2010, pp. 49-68.

* cited by examiner

METHODS AND APPARATUS FOR UPDATING A FUEL GAUGE AND ESTIMATING STATE OF HEALTH OF AN ENERGY STORAGE CELL

STATEMENT REGARDING FEDERALLY SPONSORED R&D

This invention was made with government support under grant number DTRT13-G-UTC51 awarded by the U.S. Department of Transportation and grant number N00014-11-1-0391 awarded by the U.S. Department of the Navy/Office of Naval Research. The government has certain rights in the invention.

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

BACKGROUND OF THE INVENTION

Field of the Invention

The present disclosure relates generally to energy storage devices and systems, such as battery or other electrochemical cell modules and systems, and in particular, battery modules deployed in devices or systems where the battery modules will experience charging and discharging cycles and general storage capability degradation. More particularly, the present disclosure relates to management of, accurate determination of remaining fuel or energy in and the state of charge (SOC) of, and diagnosis and determination of degradation of the battery modules and the battery cells contained therein.

Description of the Related Art

Various systems and techniques exist for measuring and tracking remaining fuel or energy in battery modules as the cells within the battery modules age and their storage capabilities degrade. Battery modules are found in countless devices that people interact with in various aspects of daily life. For example, battery modules provide power for our gadgets (e.g., mobile devices such as smartphones, tablets, laptops, and wearable devices), vehicles (e.g., electric vehicles, hybrid vehicles, etc.), and can support a power grid UH-1078 PATENT that supplies electricity to homes, business, etc. (e.g., performing frequency regulation, renewable energy storage, emergency storage, etc.). In most instances, a battery module or system is comprised of one or more electrochemical device(s) (i.e., the cell(s) or battery(ies)) and an electronic circuit that interfaces with the cell(s) and a load that the cell(s) powers. This electronic circuit may feature one or both of a charger integrated circuit (IC) and a fuel gauge IC. The charger IC may coordinate charging of the cell(s) while the fuel gauge IC may determine an amount of fuel in the cell(s) or the SOC of the cell(s).

In some battery systems (e.g., systems including multiple battery cells, such as vehicles, energy storage applications, etc.), more than one fuel gauge IC may exist. The battery system market continues to grow and with it grows the market for the fuel gauge ICs. As the prevalence of battery systems increases, the desire for more advanced and accurate readings of the state of charge of the cell(s) of the battery systems also increases. However, existing cells controllers and methods typically analyze the cells without being able to propose a diagnosis for underlying issues and therefore cannot predict the degradation. Alternatively, existing controllers and methods utilize maintenance cycles for recalibration, which is impractical under most applications. Accordingly, systems, apparatus, and methods of accurately determining a state of health (SOH) and an SOC of the cell(s) throughout the lifetime of the cell(s) are desired.

SUMMARY OF THE INVENTION

Embodiments disclosed herein address the above-mentioned problems with prior art. The systems, methods and devices of this disclosure each have several innovative aspects, no single one of which is solely responsible for the desirable attributes disclosed herein.

Various embodiments of methods and devices within the scope of the appended claims each have several aspects, no single one of which is solely responsible for the desirable attributes described herein. Without limiting the scope of the appended claims, some prominent features are described herein.

In one aspect, an embodiment of this invention comprises an apparatus for updating an active fuel gauge of an energy storage cell. The apparatus comprises a memory, a sensor, and a processor. The memory is configured to store data regarding an active fuel gauge of the energy storage cell based on a first voltage and state of charge (SOC) relationship. The sensor is configured to measure a voltage of the energy storage cell. The processor is configured to receive a first resting voltage measurement of the energy storage cell from the sensor, the first resting voltage measurement measured at a first time, receive a second resting voltage measurement of the energy storage cell from the sensor, the second resting voltage measurement measured at a second time after the first time, and receive a third resting voltage measurement of the energy storage cell from the sensor, the third resting voltage measurement measured at a third time after the second time. The processor is also configured to calculate a first difference in capacity between a first pair of the first, second, and third resting voltage measurements and a second difference in capacity between a different pair of the first, second, and third resting voltage measurements based on the first voltage and state of charge (SOC) relationship. The processor is further configured to determine whether the first and second differences are equal to each other and to a reference capacity difference. Based on that determination, when the first and second differences are equal to each other and to the reference capacity difference, the processor is configured to identify an estimate of a remaining capacity of the energy storage cell corresponding with the active fuel gauge. When the first and second differences are not equal to each other or to the reference capacity difference, the processor is configured to identify a second voltage and SOC relationship having capacity differences between pairs of the first, second, and third resting voltage measurements that are equal to each other and update the active fuel gauge based on the identified second voltage and SOC relationship.

In a second aspect, an embodiment of this invention comprises a method of updating an active fuel gauge of an energy storage cell. The method comprises receiving a first resting voltage measurement of the energy storage cell, the first resting voltage measurement measured at a first time, receiving a second resting voltage measurement of the energy storage cell, the second resting voltage measurement measured at a second time after the first time, and receiving a third resting voltage measurement of the energy storage cell, the third resting voltage measurement measured at a third time after the second time. The method further comprises calculating a first difference in capacity between a first pair of the first, second, and third resting voltage measurements and a second difference in capacity between a different pair of the first, second, and third resting voltage measurements based on a first voltage and state of charge (SOC) relationship stored in a memory and corresponding to an active fuel gauge of the energy storage cell. The method also comprises determining whether the first and second differences are equal to each other and to a reference capacity difference. When the first and second differences are equal to each other and to the reference capacity difference, the method further also comprises identifying an estimate of a remaining capacity of the energy storage cell corresponding with the active fuel gauge. When the first and second differences are not equal to each other or to the reference capacity difference, the method further also comprises identifying a second voltage and SOC relationship having capacity differences between pairs of the first, second, and third resting voltage measurements that are equal to each other and updating the active fuel gauge in the memory based on the identified second voltage and SOC relationship.

In a third aspect, an embodiment of this invention comprises an apparatus for estimating a state of health (SOH) of a battery cell. The apparatus comprises a memory, a sensor, and a processor. The memory is configured to store data regarding an active fuel gauge of the battery cell based on a first voltage and state of charge (SOC) relationship. The sensor is configured to measure a voltage of the battery cell. The processor is configured to receive a first resting voltage measurement of the battery cell from the sensor, the first resting voltage measurement measured at a first time, receive a second resting voltage measurement of the battery cell from the sensor, the second resting voltage measurement measured at a second time after the first time, and receive a third resting voltage measurement of the battery cell from the sensor, the third resting voltage measurement measured at a third time after the second time. The processor is also configured to calculate a first difference in capacity between a first pair of the first, second, and third resting voltage measurements and a second difference in capacity between a different pair of the first, second, and third resting voltage measurements based on the first voltage and state of charge (SOC) relationship. The processor is further configured to determine whether the first and second differences are equal to each other and to a reference capacity difference. Based on that determination, when the first and second differences are equal to each other and to the reference capacity difference, the processor is configured to identify an estimate of a remaining capacity of the battery cell corresponding with the active fuel gauge. When the first and second differences are not equal to each other or to the reference capacity difference, the processor is configured to identify a second voltage and SOC relationship having capacity differences between pairs of the first, second, and third resting voltage measurements that are equal to each other, update the active fuel gauge based on the identified second voltage and SOC relationship, and perform a diagnosis of the SOH of the battery cell corresponding with the identified second voltage and SOC relationship.

In a fourth aspect, an embodiment of this invention comprises a method of estimating a state of health (SOH) of a battery cell. The method comprises receiving a first resting voltage measurement of the battery cell, the first resting voltage measurement measured at a first time, receiving a second resting voltage measurement of the battery cell, the second resting voltage measurement measured at a second time after the first time, and receiving a third resting voltage measurement of the battery cell, the third resting voltage measurement measured at a third time after the second time. The method further comprises calculating a first difference in capacity between a first pair of the first, second, and third resting voltage measurements and a second difference in capacity between a different pair of the first, second, and third resting voltage measurements based on a first voltage and state of charge (SOC) relationship stored in a memory and corresponding to an active fuel gauge of the battery cell. The method also comprises determining whether the first and second differences are equal to each other and to a reference capacity difference. When the first and second differences are equal to each other and to the reference capacity difference, the method further also comprises identifying an estimate of a remaining capacity of the battery cell corresponding with the active fuel gauge. When the first and second differences are not equal to each other or to the reference capacity difference, the method further also comprises identifying a second voltage and SOC relationship having capacity differences between pairs of the first, second, and third resting voltage measurements that are equal to each other and updating the active fuel gauge in the memory based on the identified second voltage and SOC relationship, and performing a diagnosis of the SOH of the battery cell corresponding with the identified second voltage and SOC relationship.

In some of the first and third aspects, the second resting voltage measurement is received within a first threshold time of the first resting voltage measurement and the third resting voltage measurement is received within a second threshold time of the second resting voltage measurement, wherein the first threshold time is equal to the second threshold time. In some aspects of the first and third aspects, the processor is further configured to discard the first resting voltage measurement when the first threshold time is exceeded and discard the second resting voltage measurement when the second threshold time is exceeded. In some of the first and third aspects, the processor is further configured to record the first, second, and third resting voltage measurements in the memory, and identify and record in the memory a discharged capacity of the energy storage cell at each of the second resting voltage measurement and the third resting voltage measurement, wherein the first and second differences are based on the discharged capacity of the energy storage cell at each of the second and third resting voltage measurements and SOC percentages based on the first, second, and third resting voltage measurements.

In some of the first and third aspects, the processor is configured to identify a unique voltage and SOC relationship as the second voltage and SOC relationship based on at least one additional resting voltage measurement of the energy storage cell, or select the second voltage and SOC relationship from a set of voltage and SOC relationships based on statistical analysis. In some of the first and third aspects, the processor is configured to identify the set of candidate voltage and SOC relationships from a plurality of voltage and SOC relationships having capacity differences between pairs of the first, second, and third resting voltage measurements that are equal to each other based on the first, second, and third resting voltage measurements and identify the second voltage and SOC relationship from the set of candidate voltage and SOC relationships based on the statistical analysis.

In some of the first and third aspects, the processor is further configured to perform a diagnosis of an SOH of the energy storage cell. In some of the first and third aspects, the processor is further configured to perform a plurality of diagnoses of the SOH of the energy storage cell and perform a prognosis of an evolution of the SOH of the energy storage cell based on the plurality of diagnoses of the SOH of the energy storage cell. In some of the first and third aspects, the processor is further configured to discard the first, second, and third resting voltage measurements and receive replacement first, second, and third resting voltage measurements when no second voltage and SOC relationship is identified by the processor.

In some of the first and third aspects, the processor is configured to determine whether the first and second differences are within a defined percentage of each other or of the reference capacity difference, wherein when the first and second differences are within the defined percentage of each other and of the reference capacity difference, the processor is configured to identify an estimate of a remaining capacity of the energy storage cell corresponding with on the active fuel gauge, and when the first and second differences are not within the defined percentage of each other or of the reference capacity difference, the processor is configured to identify a second voltage and SOC relationship having capacity differences between pairs of the first, second, and third resting voltage measurements that are equal to each other and update the active fuel gauge based on the identified second voltage and SOC relationship.

In some of the second and fourth aspects, the second resting voltage measurement is received within a first threshold time of the first resting voltage measurement and the third resting voltage measurement is received within a second threshold time of the second resting voltage measurement, wherein the first threshold time is equal to the second threshold time. In some of the second and fourth aspects, the method includes discarding the first resting voltage measurement when the first threshold time is exceeded and discarding the second resting voltage measurement when the second threshold time is exceeded. In some of the second and fourth aspects, the method includes recording the first, second, and third resting voltage measurements in the memory and recording a discharged capacity of the energy storage cell at each of the second resting voltage measurement and the third resting voltage measurement, wherein the first and second differences are based on the discharged capacity of the energy storage cell at each of the second resting voltage measurement and the third resting voltage measurement and SOC percentages based on the first, second, and third resting voltage measurements.

In some of the second and fourth aspects, identifying a second voltage and SOC relationship comprises identifying a unique voltage and SOC relationship as the second voltage and SOC relationship based on at least one additional resting voltage measurement of the energy storage cell or selecting the second voltage and SOC relationship from a set of voltage and SOC relationships based on statistical analysis. In some of the second and fourth aspects, selecting the second voltage and SOC relationship from the set of voltage and SOC relationships comprises identifying the set of candidate voltage and SOC relationships from a plurality of voltage and SOC relationship having capacity differences between pairs of the first, second, and third resting voltage measurements that are equal to each other based on the received first, second, and third resting voltage measurements and identifying the second voltage and SOC relationship from the set of candidate voltage and SOC relationships based on the statistical analysis. In some of the second and fourth aspects, the method includes performing a plurality of diagnoses of a SOH of the energy storage cell and performing a prognosis of an evolution of the SOH of the energy storage cell based on the plurality of diagnoses of the SOH of the energy storage cell.

In some of the second and fourth aspects, the method includes discarding the first, second, and third received resting voltage measurements and receiving replacement first, second, and third resting voltage measurements when no second voltage and SOC relationship is identified by the processor. In some of the second and fourth aspects, determining whether the first and second differences are equal to each other and to a reference capacity difference comprises determining whether the first and second differences are within a defined percentage of each other or of the reference capacity difference and wherein when the first and second differences are within the defined percentage of each other and of the reference capacity difference, identifying an estimate of a remaining capacity of the energy storage cell corresponding with on the active fuel gauge or when the first and second differences are not within the defined percentage of each other or of the reference capacity difference, the method includes identifying a second voltage and SOC relationship having capacity differences between pairs of the first, second, and third resting voltage measurements that are equal to each other and updating the active fuel gauge based on the identified second voltage and SOC relationship.

BRIEF DESCRIPTION OF THE DRAWINGS

The above-mentioned aspects, as well as other features, aspects, and advantages of the present technology will now be described in connection with various embodiments, with reference to the accompanying drawings. The illustrated embodiments, however, are merely examples and are not intended to be limiting. Throughout the drawings, similar symbols typically identify similar components, unless context dictates otherwise. Note that the relative dimensions of the following figures may not be drawn to scale.

DETAILED DESCRIPTION

Figure 1:
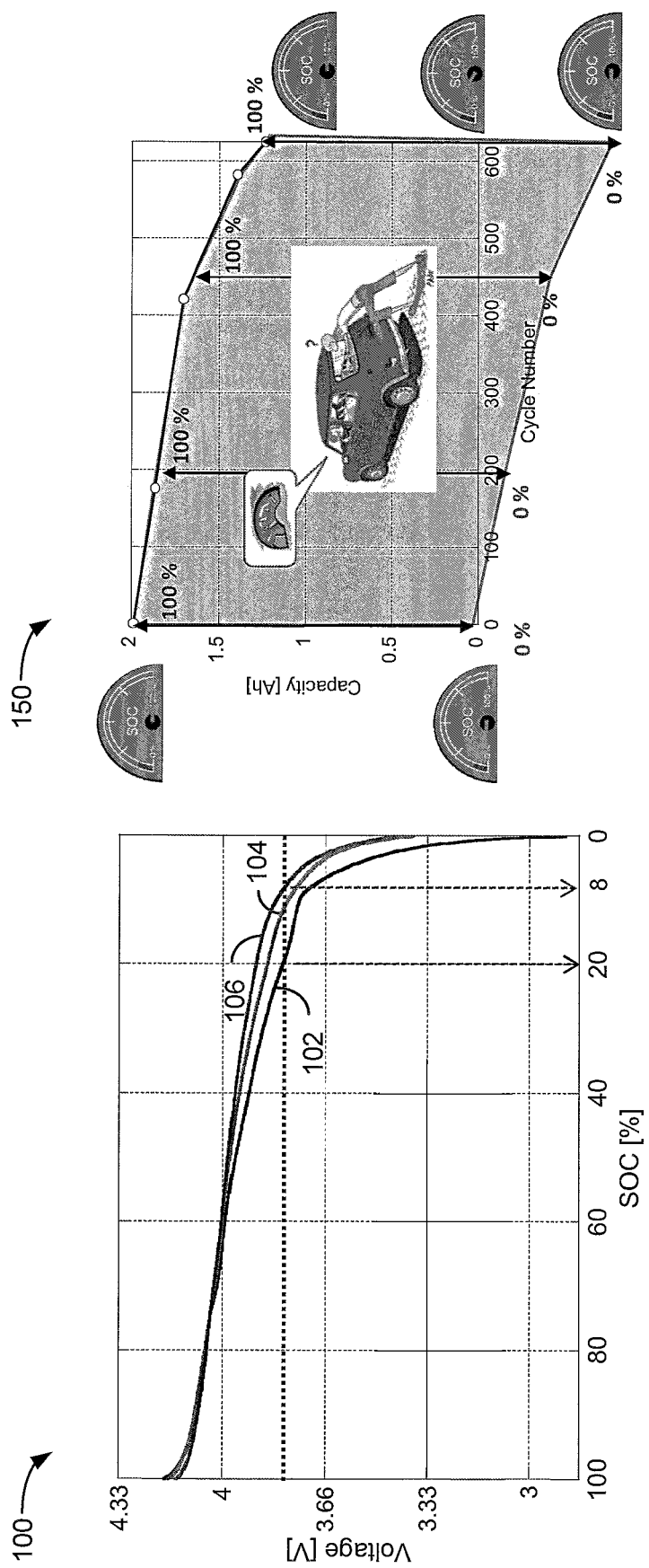
FIG. 1 depicts a graph illustrating an open cell/circuit voltage (OCV) in relation to a state of charge (SOC) of a battery cell and a graph illustrating a capacity of the battery cell in relation to a cycle number of the battery cell.

Various aspects of the novel systems, apparatuses, and methods are described more fully hereinafter with reference to the accompanying drawings. This disclosure may, however, be embodied in many different forms and should not be construed as limited to any specific structure or function presented throughout this disclosure. Rather, these aspects are provided so that this disclosure may be thorough and complete, and may fully convey the scope of the disclosure to those skilled in the art. The scope of the disclosure is intended to cover aspects of the systems, apparatuses, and methods disclosed herein, whether implemented independently of, or combined with, any other aspect of the invention. For example, an apparatus may be implemented or a method may be practiced using any number of the aspects set forth herein. In addition, the scope of embodiments of the invention, including those described herein, is intended to cover such an apparatus or method which is practiced using other structure, functionality, or structure and functionality in addition to or other than the various aspects of the embodiments set forth herein. It should be understood that any aspect disclosed herein may be embodied by one or more elements of a claim.

Although particular aspects are described herein, many variations and permutations of these aspects fall within the scope of the disclosure. Although some benefits and advantages of the preferred aspects are mentioned, the scope of the disclosure is not intended to be limited to particular benefits, uses, or objectives. Rather, aspects of the disclosure are intended to be broadly applicable to various battery or electrochemical based power storage and supply systems. The Detailed Description and drawings are intended to be illustrative of the disclosure of embodiments of the invention, rather than limiting.

As the use of battery systems becomes more pervasive, and as devices in which the battery systems are used become "smarter," more intelligent battery systems are desired. In its simplest form, the fuel gauge IC of the battery system may report a state of charge of the attached battery or energy storage cell (cell). However, additional and advanced capabilities of the fuel gauge IC may provide original equipment manufacturers (OEMs) with additional functionality and features. For example, the fuel gauge IC as described according to the present disclosure may be configured to diagnose a state of health (SOH) of the cell. The battery SOH diagnosis may incorporate a degradation of the cell since it was initially placed into operation. Additionally, the SOH diagnosis may be used to develop prognoses regarding remaining useful life of the cell. Individual cells degrade differently based on how the cells are used. For example, cells in electric vehicles may have different degradations based on the driving conditions, charging conditions, environmental conditions, etc., that the cells face.

Accurately monitoring or identifying the SOH of cells as described herein may involve a battery management system (BMS) including the fuel gauge IC and the charging IC. Various methods may be used to identify "symptoms" of the SOH of the cells. In some embodiments, the methods used may identify symptoms of the cells based on cell response data and may not require additional characterizations, destructive or otherwise. The methods used by the BMS as described herein may identify symptoms while the cells in question are in operation or online (e.g., in-operando). Furthermore, the methods described herein as used by the BMS may identify symptoms of the SOH of the cells using low complexity computations, allowing for simpler (i.e., cheaper) BMS components and ICs. Additionally, the methods implemented by the BMS may allow for determinations of changes in electrochemical behavior of the cells that can be used to estimate the remaining useful life (RUL) of the cells.

In addition to estimating the RUL of the cells, the BMS may also utilize the SOH of the cells to determine a recalibration of a state of charge (SOC) scale. The SOC scale may allow the fuel gauge IC to function as a fuel gauge of the cells (e.g., determining an amount of energy or a capacity of charge remaining in the cells based on voltage measurements of the cells). The accuracy of the SOC scale may be essential to determining an amount of energy or a capacity of charge remaining in the cells at a given time. While other methods of calibrating the SOC scale may involve using an OCV of the cell, such a calibration may be affected by battery degradation and cause the SOC scale to lose accuracy over time. This may be caused by the OCV and SOC relationship being unique to each type of cell and generally hard coded as a lookup table to in the BMS of the cell. Accordingly, as the battery module ages, the hardcoded table in the BMS is not updated, causing subsequent estimations of the SOC of the battery module to be incorrect.

This can be seen in FIG. 1, which depicts a graph 100 illustrating an open cell voltage (OCV) in relation to a state of charge of a battery cell and a graph 150 illustrating a capacity of the battery cell in relation to a cycle number of the battery cell. The graph 100 shows the OCV of the cell as a function of the SOC of the cell. Accordingly, the SOC of the cell is shown along the x-axis as a percentage and the SOC is shown along the y-axis as a voltage (V). The graph 150 shows the capacity of the cell as a function of the number of cycles of the cell. Accordingly, the quantity of cycles of the cell is shown along the x-axis as a number of cycles while the capacity of the cell is shown along the y-axis as amp-hours.

The graph 100 includes three lines (102-106) each depicting the relationship between the OCV and the SOC at different stages of life of the battery cell. The line 102 shows the relationship between the OCV and the SOC of the battery cell at the beginning of the battery cell's life. The line 104 shows the relationship between the OCV and the SOC of the battery cell at the middle of the battery cell's life. The line 106 shows the relationship between the OCV and the SOC of the battery cell at the end of the battery cell's life. As shown, the lines 102-106 show similar voltages between 100 and approximately 60% of the SOC of the cell. However, after 60% of the SOC of the cells, the lines 102-106 begin to diverge. From that point, the line 102 is generally higher than the lines 104 and 106. Thus, the lines 102-106 may generally show that as the battery cell ages, the OCV of the battery is reduced as the SOC approaches zero. For example, while the battery cell has an SOC of 20% with an OCV of approximately 3.75V when it is new, the same battery cell may have an SOC of 8% with an OCV of approximately 3.75V when it is aged. Accordingly, the SOC is not updated to reflect the actual life or remaining capacity of the battery cell.

The graph 150 includes a single line 152 tracking the relationship between the capacity of the battery cell, the number of cycles of the battery cell, and the SOC of the battery cell. Each cycle may correspond to a discharge and a charge of the battery cell. Thus, as shown by the graph 150, as the battery cell is charged and discharged over the course of its life, its capacity is reduced (e.g., at 100% SOC, the battery capacity is shown to be approximately 1.2 Amp hours (Ah), where the initial battery capacity was 2.0 Ah at 100% SOC). However, as discussed above, when the SOC is not updated as the battery cell ages, the SOC may improperly indicate or expect a charge to exist in the battery cell when none exists, e.g., when the SOC only reaches zero well below the 0 Ah capacity of the battery cell. Thus, a fuel gauge based on the SOC here may incorrectly estimate that some capacity is remaining in the battery cell when it is actually depleted (as shown by the SOC extending below the 0 Ah capacity of the battery cell).

Thus, the graphs 100 and 150 of FIG. 1 show the benefit available for a system and method of recalibrating the SOC scale as the battery cell ages. The present disclosure provides for a recalibration of the SOC scale without requiring complicated calculations or downtime for the battery cell. The present disclosure may further allow for diagnosis of conditions and states of the battery cell based on information acquired while the battery cell is at rest (e.g., not being charged or discharged or charged/discharged at low currents relative to the battery size) and information regarding the chemistry of the battery cell. The systems and methods of the present disclosure may be applied to any battery chemistry, though the battery cell discussed herein for illustrative purposes may be disclosed within the context of lithium-ion and/or sodium-ion chemistries.

The present disclosure involves determining a capacity ratio ($Q_r$). The capacity ratio $Q_r$ may refer to a ratio of a net capacity (e.g., capacity of charge) change ($\Delta Q$) over a change in a state of charge ($\Delta SOC$) of the battery cell. See Equation 1 below.

$$Q_r = \frac{|\Delta Q|}{|\Delta SOC|} \qquad \text{Equation 1}$$

Where:
  $\Delta Q$ is the change in capacity measured in Ah,
  $\Delta SOC$ is the change in the state of charge, measured in %, and
  $Q_r$ is the capacity ratio.

One or more of the $\Delta Q$ and the $\Delta SOC$ may be inferred based on rest or resting cell voltage (RCV) measurements of the battery cell and the relationship between the OCV of the battery cell and the SOC of the battery cell. In some embodiments, the relationship between the OCV and the SOC of the battery cell may be determined based on an OCV=f(SOC) lookup table for the battery cell.

Recalibration of the SOC scale and the diagnosis of the battery cell may be achieved by finding an OCV and SOC relationship that generates or satisfies one or more $Q_r$ values derived from a collection of RCV and $\Delta Q$ measurements. In some embodiments, the OCV and SOC relationship may be selected or identified to generate or satisfy a plurality, a majority, or all of the $Q_r$ values derived from the collection of RCV and $\Delta Q$ measurements. In some aspects, different OCV and SOC relationships of various aging conditions can be calculated during manufacture or design (e.g., before use) and stored in a look up table in a memory. In some aspects, these relationships may be generated or identified on demand using an integrated or embedded computation unit (e.g., processor) based, at least in part, on a dataset including data regarding intercalation potential curves of materials specific to the battery cell chemistry. In some aspects, calculations of the OCV and SOC relationships can be derived from variations of thermodynamic parameters, such as a loading ratio (LR) between capacities of both electrodes of the battery cell and an SOC offset between the electrodes (OFS). The LR may correspond to a capacity ratio between the two electrodes of the battery cell. The OFS may correspond to a shift between the electrodes induced during a formation of the battery cell. For example, the OFS may correspond to an initial solid-electrolyte interphase (SEI) growth and/or irreversible material loss during the first cycles of the battery cell. For example, as will be explained further below, the OFS may correspond to a left or right shift of a positive electrode and/or a negative electrode half-cell.

A combination of an OCV and SOC relationship and a $Q_r$ value may be unique to a particular state-of-health (SOH) of the battery cell being diagnosed. In some aspects, the OCV and SOC relationship may be implemented as a primary lookup table for the SOC estimation. Based on the OCV and SOC relationship by which the $Q_r$ value may be identified, a thermodynamic capacity ($Q_{TH}$) may be identified along with a new SOH of the battery cell. The $Q_{TH}$ may correspond to a maximum capacity of the battery cell (e.g., the capacity of the battery cell that would be obtained if the battery cell were discharged at as slow a rate as possible). The $Q_{TH}$ value may be determined by multiplying the determined $Q_r$ by 100 (e.g., $Q_{TH}=Qr*100$). Using the OCV and SOC relationships as a base, the LR and OFS of the OCV and SOC relationship, in combination with the $Q_r$, may assist in assessing battery degradation mechanisms and values. From the relationships between these parameters, degradation of the battery cell may be separated into individual components. For example, for a lithium-ion battery cell, examples of the individual components of degradation of the battery cell may include a loss of lithium inventory (LLI), loss of an active material on the positive electrode (LAM$_{PE}$) and loss of an active material on the negative electrode (LAM$_{NE}$). The LAM values may measure a percentage of the respective electrode that is inactive for intercalation in the battery cell. Accordingly, the LAM$_{PE}$ and LAM$_{NE}$ are electrode specific (positive and negative electrodes). On the other hand, the LLI may represent a global inventory of lithium that is available for intercalation.

Figure 2:
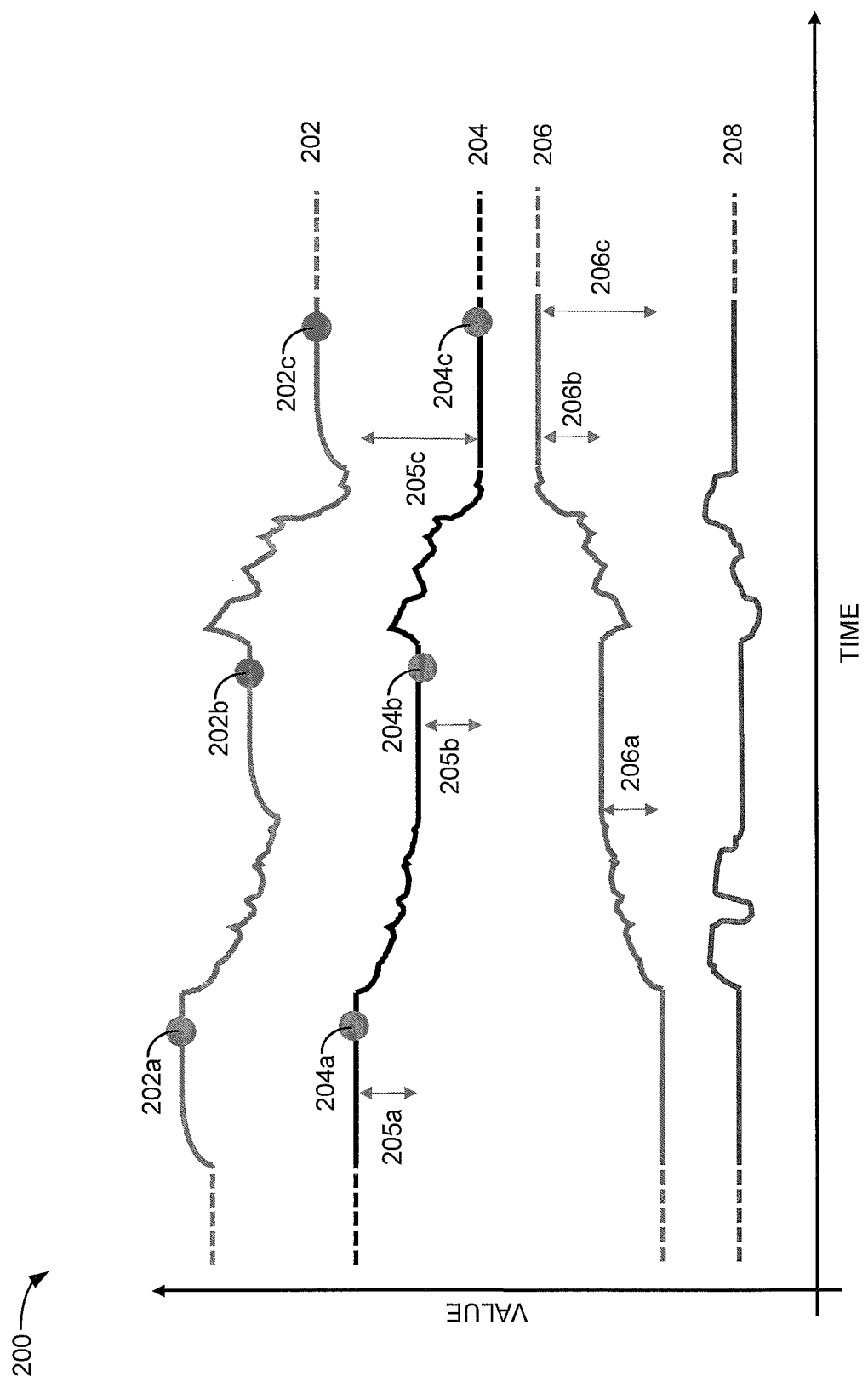
FIG. 2 depicts a graph showing variations in a voltage, a state of charge (SOC), a capacity, and a current of a battery cell and corresponding information that may provide for the recalibration of the SOC and the diagnosis of the battery cell.

FIG. 2 depicts a graph 200 showing variations in the voltage, the SOC, the capacity, and a current of a battery cell and corresponding information that may provide for the recalibration of the SOC and the diagnosis of the battery cell. The graph 200 shows a combination of voltage, SOC percentage, discharged capacity of the battery cell in amp hours (Ah), and current in amps (A) along the y-axis as a function of time along the x-axis. Accordingly, the graph 200 shows how the voltage, the SOC, the capacity, and the current of the battery cell change in relation to each other over time. Thus, the graph 200 includes lines 202-208. Line 202 corresponds to the voltage of the battery cell over time. Line 204 corresponds to the SOC percentage of the battery cell over time. Line 206 corresponds to the discharged capacity of the battery cell. Line 208 corresponds to the current of the battery cell.

The line 202 corresponding to the voltage of the battery cell shows three "rest periods." The rest periods may correspond to periods of time during which the voltage, as represented by the line 202, remains constant or substantially constant. At the same time, the current may be zero or close to zero. In some embodiments, the current may be substantially less than a ratio of current over a capacity of the battery cell. For example, the current ratio may be (C/50), representing a current that is discharged over fifty hours. In some embodiments, the current ratio may be less than (C/5), or less than a current that will discharge the battery cell in five hours. In some embodiments, the current ratio may be (1C), or less than a current that will discharge the battery cell over one hour. Accordingly, as shown by the line 202 and points 202a, 202b, and 202c, the voltage of the battery cell experiences at least three rest periods. From viewing the lines 204-208 during these rest periods, the voltage rest periods correspond to periods when the current of the battery cell is or is substantially zero. Additionally, from comparing the lines 202-208, the rest periods for the voltage of the battery cell correspond to periods where the SOC percentage and the capacity of the battery cell also remain constant or substantially constant. The points 202a-202c may correspond to potentials of the battery cell during the identified rest periods. These potentials may correspond to the RCVs discussed herein. For example, the point 202a (e.g., RCV$_1$) may be a first resting cell voltage of the battery cell, while the points 202b (RCV$_2$) and 202c (RCV$_3$) may be the second and third resting cell voltages of the battery cell, respectively. In some embodiments, though only three RCV values or measurements are shown, more than three RCV measurements may be used to determine the recalibrated SOC and the battery cell diagnosis.

Based on these measured RCV values (e.g., applying the measured RCV values as OCV values), the corresponding SOC percentages can be identified based on an active OCV and SOC relationship (e.g., identified based on the OCV and SOC relationship lookup table, the embedded computation unit, etc.). The corresponding SOC percentages are shown as points 204a, 204b, and 204c. These percentages correspond to the RCV values of the points 202a, 202b, and 202c, respectively. From the corresponding SOC percentages of points 204a-204c, changes in SOC 205a-205c may be determined. Thus, a ASOC$_{12}$, 205a, corresponding to the change in the SOC between RCV$_1$ and RCV$_2$, may be determined. Similarly, the ASOC$_{23}$ 205b may be determined based on the points 204b and 204c (corresponding to RCV$_2$ and RCV$_3$) and the ASOC$_{13}$ 205c may be determined based on the points 204a and 204c (corresponding to RCV$_1$ and RCV$_3$).

Additionally, changes in the capacity of the battery cell may be determined for similar periods. For example, $\Delta Q_{12}$, 206a, corresponding to a change in the capacity between the time of the measurement of the RCV2 value and the RCV1 value is depicted on the graph 200. Similarly, $\Delta Q_{23}$, 206b, corresponding to a change in the capacity between the time of the measurement of the RCV3 value and the RCV2 value and $\Delta Q_{13}$, 206c, corresponding to a change in the capacity between the time of the measurement of the RCV3 value and the RCV1 value are depicted on the graph 200.

Using the ASOC values and the $\Delta Q$ values discussed herein, the capacity ratios, in Ah/SOC %, may be determined based on Equation 1. In some embodiments, the battery cell capacity ratios may be calculated for two of the three sets of $\Delta Q$ and $\Delta$SOC values. If the battery cell capacity ratios apply for two of the $\Delta$SOC values and the $\Delta Q$ values, the battery cell capacity ratios should apply to the third of the ASOC values and the $\Delta Q$ values. In some embodiments, the cell capacity ratios may be calculated for at least two of the identified RCV intervals. In some embodiments, the battery cell capacity ratio may be calculated based on at least two of the $\Delta$SOC values and the $\Delta Q$ values. If the Qr ratio values calculated based on Equation 1 and the $\Delta$SOC and $\Delta Q$ values discussed herein are the same, then the active OCV and SOC relationship is accurate. If the Qr ratio values calculated based on Equation 1 are not the same, then the active OCV and SOC relationship may be inaccurate. If the active OCV and SOC relationship is inaccurate, then the OCV and SOC relationship may be recalculated and retested using the RCV values measured as described above. If the active OCV and SOC relationship is shown to be accurate, then the calculated Q$_r$ values can be used to determine the Q$_{TH}$ value based on Equation 2.

$$Q_r = \frac{Q_{TH}}{100} \qquad \text{Equation 2}$$

However, when the active OCV and SOC relationship is not accurate, the correct OCV and SOC relationship must be identified and the Q$_{TH}$ is updated based on Equation 2.

In some embodiments, the OCV and SOC relationship may be calculated or recalculated to account for battery cell degradation. In one aspect, the OCV and SOC relationship may be calculated or recalculated based on cell modeling. Cell modeling may provide for replicating or simulating the electrochemical response of battery cells in view of any degradation mechanisms. In some aspects, the OCV and SOC relationship may be calculated or recalculated based on other models or approaches for correlating battery cell parameters with battery cell degradation parameters.

Cell modeling may utilize a half-cell (or half-cell data) that applies information regarding electrochemical performance of each electrode of the battery cell with a reference electrolyte. In some embodiments, the half-cell data may be obtained from experimental data, from experimental data fits, or simulated half-cell data. The half-cells for each of the electrodes of the battery cell may be matched or combined to replicate or simulate the electrochemical performance of the full battery cell. Proper matching or selection of the half-cells may depend on one or more of the LR and the OFS of the battery cell, discussed herein.

Figure 3:
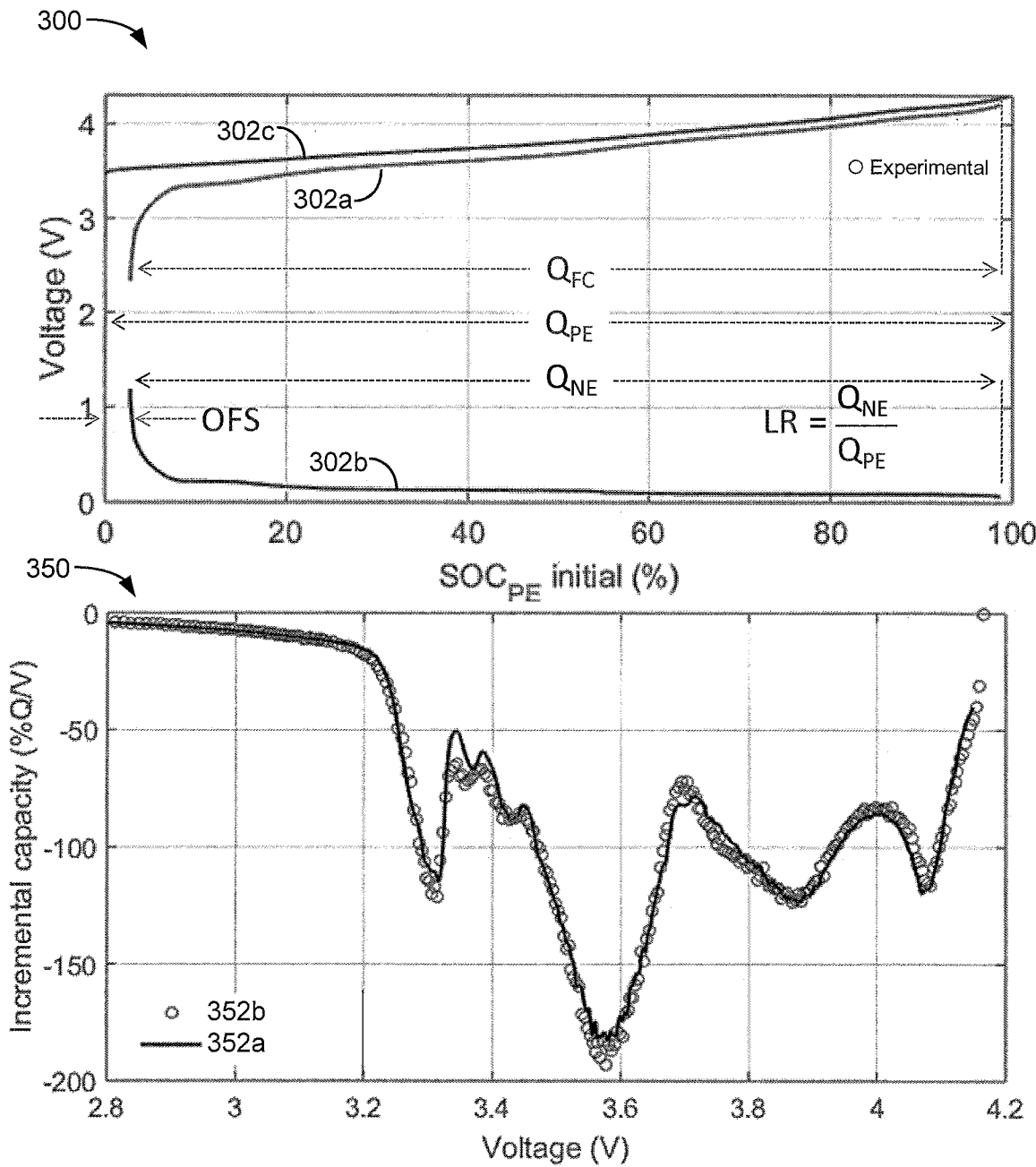
FIG. 3 depicts a graph illustrating a loading ratio and an offset for the battery cell and a graph illustrating a comparison of experimental battery cell data and emulated battery cell data for the battery cell.

FIG. 3 depicts a graph 300 illustrating a loading ratio and an offset for the battery cell and a graph 350 illustrating a comparison of experimental battery cell data and emulated battery cell data for the battery cell. The graph 300 shows an initial SOC percentage for a positive electrode of the battery cell along an x-axis and a voltage along the y-axis. The graph 350 shows a voltage (V) along the x-axis and an incremental capacity (%Q/V) along the y-axis.

Three lines 302a, 302b, and 302c are shown on the graph 300. The line 302a may correspond to full cell data, while the lines 302b and 302c may correspond to negative electrode half-cell data and positive electrode half-cell data, respectively. The full cell data of line 302a may correspond to a sum of the negative electrode half-cell data and the positive electrode half-cell data of lines 302b and 302c.

The graph 350 includes two lines 352a and 352b. The line 352a may correspond to the battery cell that is to be simulated using the cell emulation as described herein. The line 352b may correspond to the experimental battery cell. As shown, the simulated battery cell "measurement" values closely track the values of the battery cell. Thus, the cell emulator is shown to provide estimates that are very similar or exact in comparison to the battery cell itself. Since any degradation of the battery cell may influence its OCV and SOC relationship, any variation in the OCV and SOC relationship as shown in graph 300 of FIG. 3 may be explained or attributed to a change of the LR or the OFS. Accordingly, the battery cell that is properly emulated using cell emulation may simulate any possible OCV and SOC relationship by varying the LR and the OFS. Thus, all variations of battery cell degradation may be simulated and an updated or new lookup table may be generated according to the LR vs. the OFS vs. the OCV vs. the SOC. Alternatively, or additionally, an emulation or computation module or unit may be embedded with the half-cell data to simulate the OCV and SOC relationship (and associated curve) on demand.

Once the accurate active OCV and SOC relationship is identified, the corresponding LR and OFS values (e.g., the LR and OFS values that are used to simulate battery cell to simulate the accurate OCV and SOC relationship can be used to diagnose the degradation of the battery cell according to Equations 3-5 below.

$$LR = \frac{Q_{NE}}{Q_{PE}} = \frac{100 - \% LAM_{NE}}{100 - \% LAM_{PE}} LR_{initial} \qquad \text{Equation 3}$$

Where:
LR is the loading ratio of the battery cell,
$Q_{NE}$ is the capacity of the negative electrode, in Ah,
$Q_{PE}$ is the capacity of the positive electrode, in Ah,
% $LAM_{NE}$ is the percentage of the lost active material of the negative electrode,
% $LAM_{PE}$ is the percentage of the lost active material of the positive electrode, and
$LR_{ini}$ is the initial loading ratio of the battery cell (e.g., the loading ratio of the battery cell when the battery cell is new or substantially new). In some embodiments, the LR may correspond to the capacity of the negative electrode in relation to the capacity of the positive electrode.

$$OFS = OFS_{initial} + LR*\% LAM_{liNE} - \frac{LR}{LR_{initial}}*\% LAM_{dePE} + \% LLI \qquad \text{Equation 4}$$

Where:
OFS is the current offset of the battery cell, where the OFS may correspond to a left or right shift of a positive electrode and/or a negative electrode half-cell (e.g., in the graph 300 of FIG. 3.
$OFS_{initial}$ is the initial offset of the battery cell (e.g., the offset of the battery cell when the battery cell is new or substantially new),
LR is the current loading ratio of the battery cell,
% $LAM_{liNE}$ is the percentage of loss on the lithiated negative electrode,
$LR_{initial}$ is the initial loading ratio of the battery cell,
% $LAM_{dePE}$ is the percentage of delithiated positive electrode, and
% LLI is the percentage of the lost lithium inventory.

$$Q_r = \frac{(1 - OFS)*Q_{NE}}{100*LR} \qquad \text{Equation 5}$$

Where:
$Q_r$ is the ratio of capacity change in the battery cell,
OFS is the offset of the battery cell,
LR is the loading ratio of the battery cell, and
$Q_{NE}$ is the capacity of the negative electrode.

Accordingly, the LLI and the $LAM_{PE}$ and $LAM_{NE}$ may be determined and quantified based on the Equations 3-5 as the battery cell ages.

Figure 4:
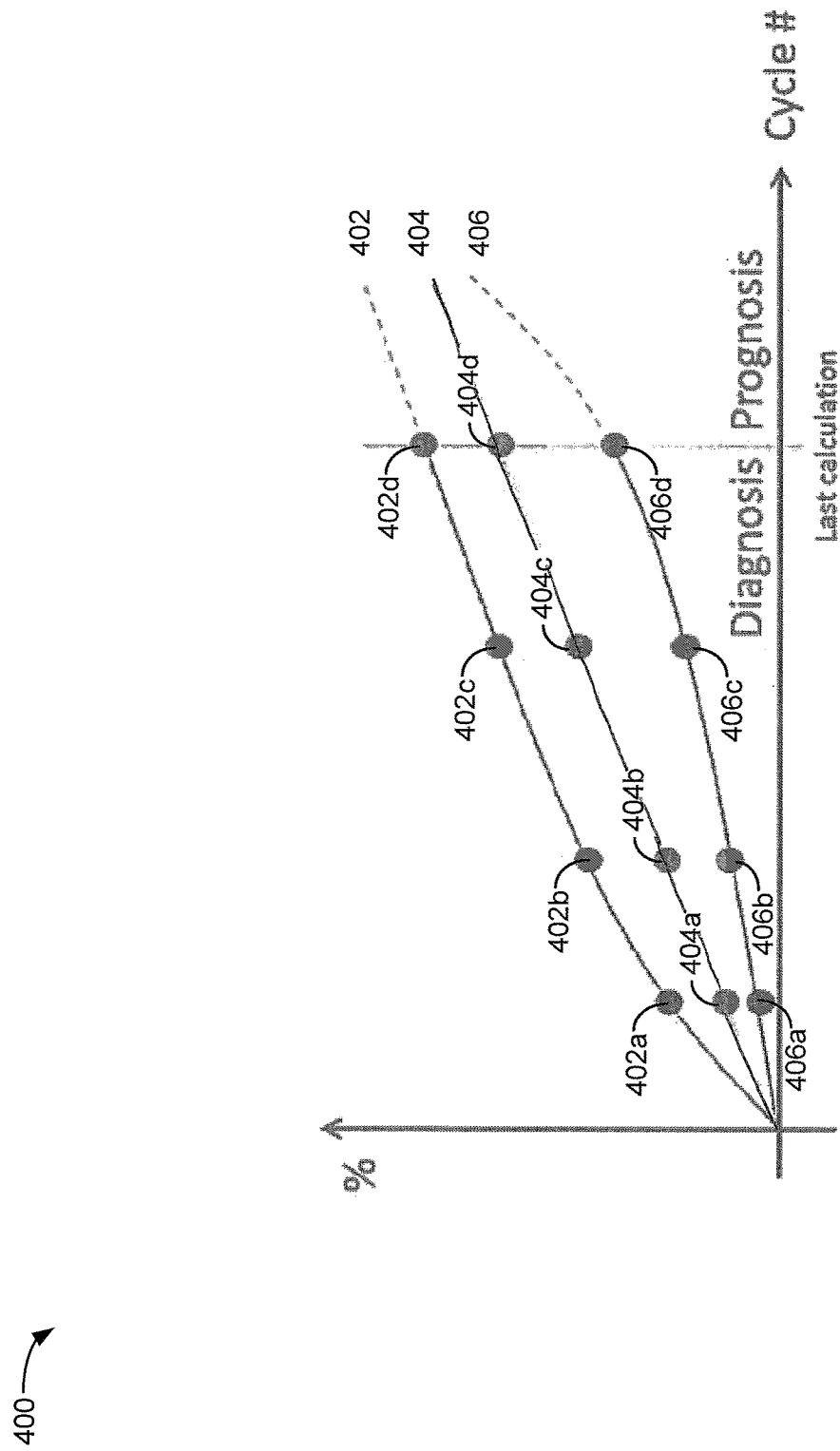
FIG. 4 depicts a graph illustrating diagnosed lost material values that provide for predictable future material loss values as the number of cycles of the battery cell increases.

FIG. 4 depicts a graph 400 illustrating diagnosed lost material values that provide for predictable future material loss values as the number of cycles of the battery cell increases. The graph 400 includes a number of cycles along the x-axis while a percentage of material lost is shown along the y-axis. The graph 400 includes three lines 402-406. The line 402 corresponds to an amount of lost active material of the positive electrode (LAMPE). The line 404 corresponds to an amount of lost lithium inventory (LLI). The line 406 corresponds to an amount of lost active material of the negative electrode. Each of these lines 402-406 shows an increased percentage of lost material as the number of cycles of the battery cell increases (e.g., as the battery cell ages). Additionally, if each of the lost material values are determined on a periodic basis, it may become possible to predict future material losses. For example, each of lines 402-406 includes four measured points (402a-402d, 404a-404d, and 406a-406d), respectively. Based on these measured points, it may be possible to extrapolate or estimate future material losses over time that occur on the same or similar periodic basis. Additionally, based on these extrapolated values and based on Equations 3-5, capacity loss of the battery cell and the OCV and SOC relationship of the battery cell may be predictable.

Figure 5A:
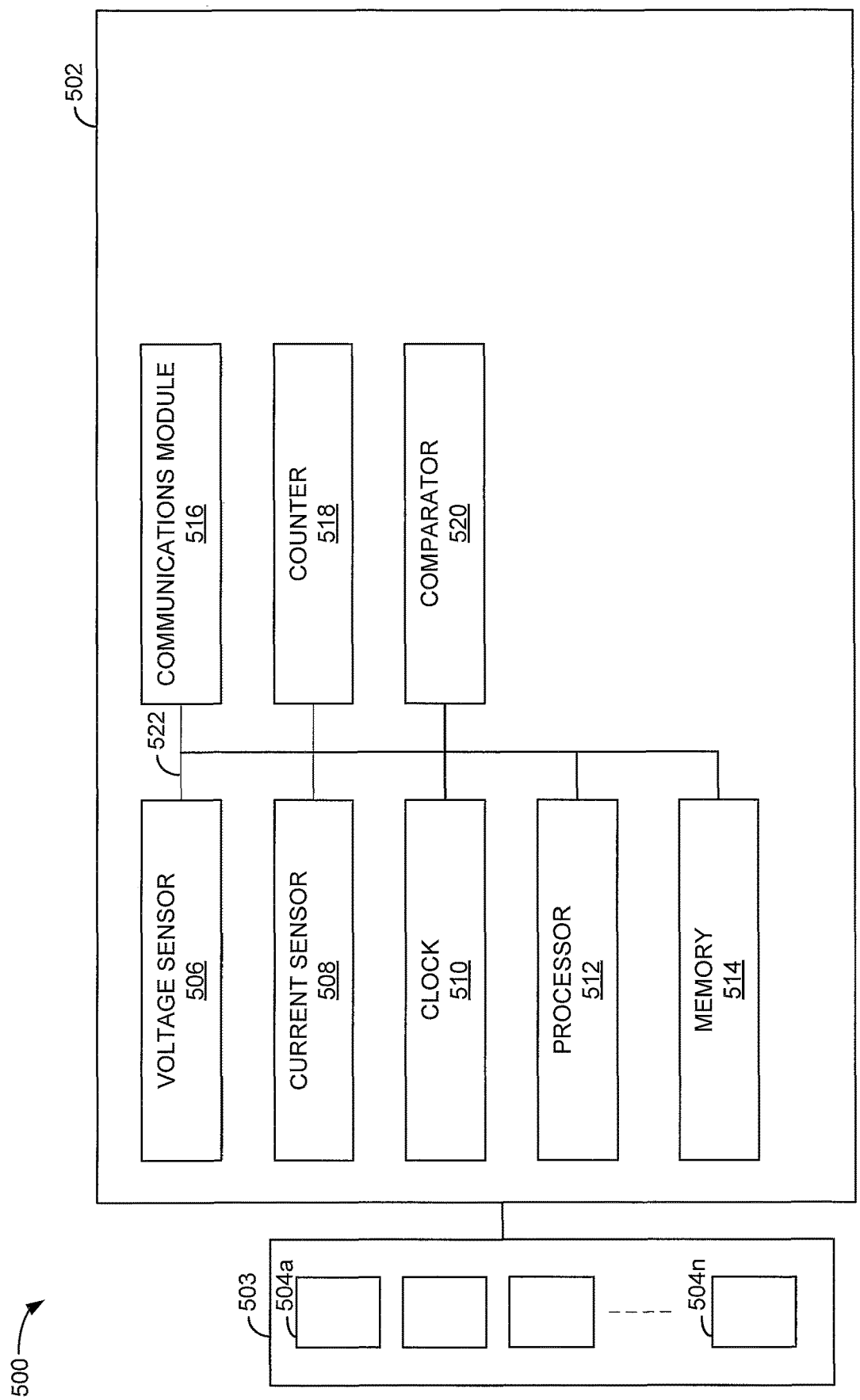
FIGS. 5A and 5B illustrate various components (FIG. 5A) that may be utilized in a battery management system (BMS) that may be employed and the functions (FIG. 5B) that the components may perform, as described herein and as discussed in relation to FIGS. 2-4.
Figure 5B:
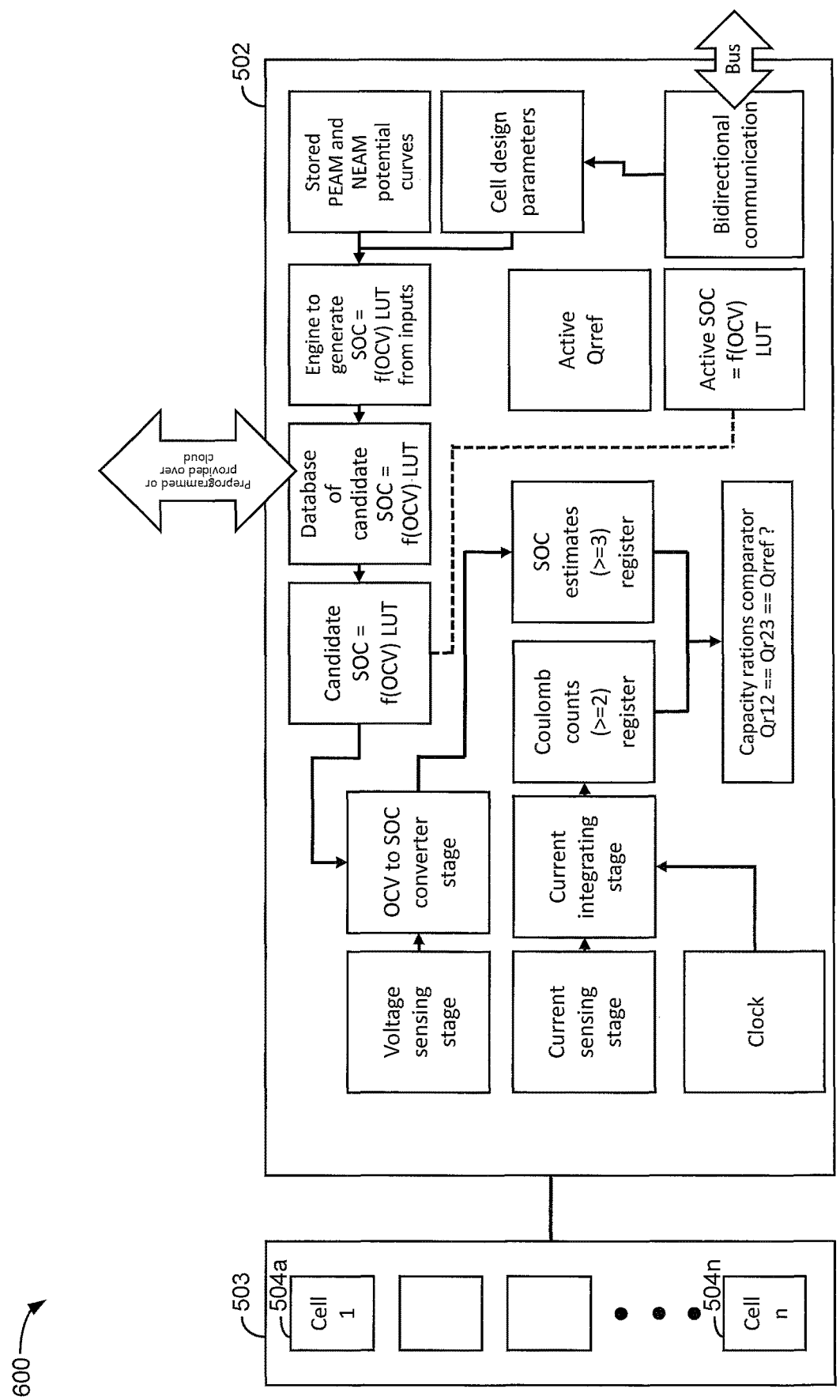

FIGS. 5A and 5B illustrate various components (FIG. 5A) that may be utilized in a battery management system (BMS) 502 that may be employed and the functions (FIG. 5B) that the components may perform, as described herein and as discussed in relation to FIGS. 2-4. A battery system 500 can include the BMS implemented to interact with a battery module 503 comprising a plurality of battery cells 504. The BMS 502 is an example of a device that can be configured to implement the various methods described herein. With respect to the description of FIGS. 5A and 5B herein, some of the item numbers may refer to the so-numbered aspects described above in connection with FIGS. 1-4. The battery cells 504, comprising a quantity n of battery cells 504 (e.g., battery cells 504a-504n) may be coupled in series or in parallel, and the entire series of battery cells 504 may be coupled to the BMS 502, individually or as a whole.

The BMS 502 may include a plurality of components that allow the BMS 502 to perform the functions as discussed herein. For example, the BMS 502 may include a voltage sensor 506 and a current sensor 508. The voltage sensor 506 may sense or measure a voltage of one or more of the cells 504 in the battery module 503, while the current sensor 508 may sense or measure a current through one or more of the cells 504 in the battery module. The BMS 502 may further include a clock 510 and a processor 512. The clock 510 may measure or track time while the processor 512 may perform various calculations, conversions, and other tracking functions. The BMS 502 may further include a memory 514. The memory 514 may include a database or similar storage structure or component for storing information. The BMS 502 may also include a communications module 516, a counter 518, and a comparator 520. The communications module 516 may allow the BMS 502 to communicate with other systems (e.g., power control systems, other BMS 502 units, etc.). The counter 518 may count a number of events, measurements, etc., as needed. The comparator may compare values of two inputs or may compare values in the memory 514.

For example, the voltage sensor 506 may sense or measure a voltage of the coupled cell 504a or the battery module 503 and store that sensed or measured value in the memory 514. The voltage sensor 506 may determine when the battery cell 504a is idle (e.g., not being charged or discharged). Accordingly, the voltage sensor 506 may determine if the voltage of the battery cell 504a is changing or idle. Additionally, the voltage sensor 506 may measure or sense the voltage at particular times to acquire the measurement. For example, once the battery cell 504a is determined to be idle, the voltage sensor 506 may measure the voltage of the battery cell 504a curing the idle period. In some embodiments, this measurement may correspond to one of the RCV measurements used to recalibrate the battery cell SOC scale or diagnose the battery cell 504a. Accordingly, when the voltage sensor 506 measures the RCV value of the battery cell 504a, this measurement may be stored in the memory 514 or may be passed to the processor 512 for processing.

The current sensor 508 may sense or measure a current of the coupled cell 504a or the battery module 503 and store that sensed or measured value in the memory 514. The current sensor 508 may determine when the battery cell 504a is idle (e.g., not being charged or discharged) or approximately idle (e.g., low current being applied) based on the current flow in or through the battery cell 504a. Accordingly, the current sensor 508 may determine if the battery cell 504a is idle. Additionally, the current sensor 508 may measure currents in or through the battery cell 504a to determine a capacity or change in capacity of the battery cell 504a over time. For example, the current sensor 508 may measure the current of the battery cell 504c (as shown by line 208) to determine the capacity Q or the change in capacity $\Delta Q$ as shown by line 206 and values 206a-206c, respectively.

The clock 510 may track time in various conditions. For example, the clock 510 may be used to determine whether the battery cell 504a is idle for a sufficient amount of time before measuring the RCV. Accordingly, the clock 510 may be used to ensure the battery cell 504a is idle for the proper time before each RCV measured. Additionally, the clock 510 may be used to track any of the values or time as shown in FIG. 2.

The processor 512 may control operation of the BMS 502. The processor 512 may also be referred to as a central processing unit (CPU) or hardware processor. The processor 512 may comprise or be a component of a processing system implemented with one or more processors. The one or more processors may be implemented with any combination of general-purpose microprocessors, microcontrollers, digital signal processors (DSPs), field programmable gate array (FPGAs), programmable logic devices (PLDs), controllers, state machines, gated logic, discrete hardware components, dedicated hardware finite state machines, or any other suitable entities that can perform calculations or other manipulations of information.

The processing system may also include non-transitory machine-readable media for storing software. Software shall be construed broadly to mean any type of instructions, whether referred to as software, firmware, middleware, microcode, hardware description language, or otherwise. Instructions may include code (e.g., in source code format, binary code format, executable code format, or any other suitable format of code). The instructions, when executed by the one or more processors, cause the processing system to perform the various functions described herein. The processor 512 may further comprise a packet generator to generate packets for controlling operation and data communication.

The processor 512 may receive measured values from the memory 214 or the voltage sensor 506 or the current sensor 508. In some embodiments, the processor 512 may identify the SOC of the battery cell 504a based on the measured RCV by the voltage sensor 506 using information stored in the memory 514 (e.g., the OCV and SOC relationship lookup table) or by calculating the relationship between the OCV and the SOC, as described herein. In some embodiments, the processor 512 may also determine the change in capacity ($\Delta Q$) of the battery cell 504a based on an integration of information from the current sensor 508 over time from the clock 510. In some embodiments, the processor 512 may, in conjunction with or independent of the counter 518, track or count a number of capacity changes that have been measured or calculated and/or track or count a number of RCV values measured during idle periods.

In some embodiments, the processor 512 may further generate the OCV and SOC relationship lookup table for storage in the memory 514 based on information stored in the memory 514 (e.g., positive electrode active material (PEAM) and/or negative electrode active material (NEAM) potential curves and battery cell 504a design parameters). In some embodiments, the potential curves may be obtained via or from experimental data, fitting, or modeling. In some embodiments, the processor 512 may, in conjunction with or independent of the comparator 520, compare the measured or determined capacity values and changes in capacity to determine if the active OCV and SOC relationship is accurate.

The memory 514, which may include both read-only memory (ROM) and random access memory (RAM), may provide instructions and data to the processor 512. A portion of the memory 514 may also include non-volatile random access memory (NVRAM). The processor 512 typically performs logical and arithmetic operations based on program instructions stored within the memory 514. The instructions in the memory 514 may be executable to implement the methods described herein. Furthermore, the BMS 502 may utilize the memory 514 to store the information about the PEAM and NEAM potential curves and battery cell 504 design parameters. In some embodiments, the active OCV and SOC relationship may be tracked or otherwise identified and stored. In some embodiments, the active reference capacity change is also stored. In some embodiments, the memory 514 may also store a database of potential OCV and SOC relationship lookup tables and the selected or active OCV and SOC relationship lookup table. In some embodiments, values measured by the voltage sensor 506 or the current sensor 508 may be stored in the memory 514. The BMS 502 may utilize the processor 512 in connection with the memory 514 to analyze the stored data and determine and/or identify various information and/or perform various calculations according to current parameters, stored information, and current inputs or settings.

The counter 518 may count the number of RCV values identified (e.g., number of voltage measurements during idle or resting periods of the battery cell 504a) and/or a number of capacity change ($\Delta Q$) determinations based on the RCV values. In some embodiments, the counts may be stored in the memory 514 or provided to the processor 512 for processing. In some embodiments, the functions of the counter 518 may be incorporated into the processor 512. In some embodiments, the counter 518 may ensure that at least two capacity changes are determined and at least three RCV values are identified for the battery cell 504a.

The comparator 520 may compare the change in capacity of the battery cell 504a between the first and second RCV values and the second and third RCV values and ensure that these values are equal to each other and a reference change in capacity value. Qrref may be initially programmed or determined by the processor 512. In some embodiments, the Qrref value may be determined based on the previous battery cell SOC, SOH, and degradation calculations performed by the processor 512. In some embodiments, a result of the comparison performed by the comparator 520 may be stored in the memory 514 or provided to the processor 512 for processing. In some embodiments, the functions of the comparator 52 may be incorporated into the processor 512.

The BMS 502 may include the communication module 516 to allow transmission and reception of data between the BMS 502 and another device or location. The communication module 516 may comprise a transceiver or may comprise a separate receiver circuit and a separate transmitter circuit (not shown). The communication module 516 may also comprise one or more antennae (not shown) electrically coupled to the communication module 516. The BMS 502 may also include (not shown) multiple transmitters, multiple receivers, multiple transceivers, and/or multiple antennas, which may be utilized during multiple-input multiple-output (MIMO) communications, for example. In some embodiments, each of the multiple antennas may be dedicated for the transmission and/or reception of LTE-U, LTE-D, MuLTEfire, and/or WLAN communications, and/or any other mode of wired or wireless communication. In some embodiments, the communication module 516 may receive information to update items in the memory 514, such as the database of candidate OCV and SOC relationship lookup tables or PEAM and NEAM potential curves and cell design information. In some embodiments, the BMS 502 may request updated information to ensure that it is utilizing the latest information in the associated calculations. The BMS 502 may also be covered by a housing unit (not shown).

For example, the BMS 502 may comprise a LAN modem for communicating with LAN devices. For example, the LAN modem can enable the BMS 502 to send, receive, and process LAN communications. The LAN modem 238 may contain processing capabilities to operate in both the physical (PHY) layer and the medium access control (MAC) layer for LAN.

The BMS 502 may further comprise a user interface (not shown) in some aspects. The user interface may comprise a keypad, a microphone, a speaker, and/or a display. The user interface may include any element or component that conveys information to a user of the BMS and/or receives input from the user.

Various components of the BMS 502 may be coupled together by a bus system 522. The bus system 522 may include a data bus, for example, as well as a power bus, a control signal bus, and a status signal bus in addition to the data bus. Those of skill in the art will appreciate various components of the BMS 502 may be coupled together or accept or provide inputs to each other using some other mechanism.

Although a number of separate components are illustrated in FIG. 5A, those of skill in the art will recognize that one or more of these components may be implemented not only with respect to the functionality described above, but also to implement the functionality described above with respect to other components. For example, the processor 512 may be used to implement not only the functionality described above with respect to the processor 512, but also to implement the functionality described above with respect to the comparator 520 and/or the counter 518. Each of the components illustrated in FIG. 5A may be implemented using a plurality of separate elements.

Figure 6A:
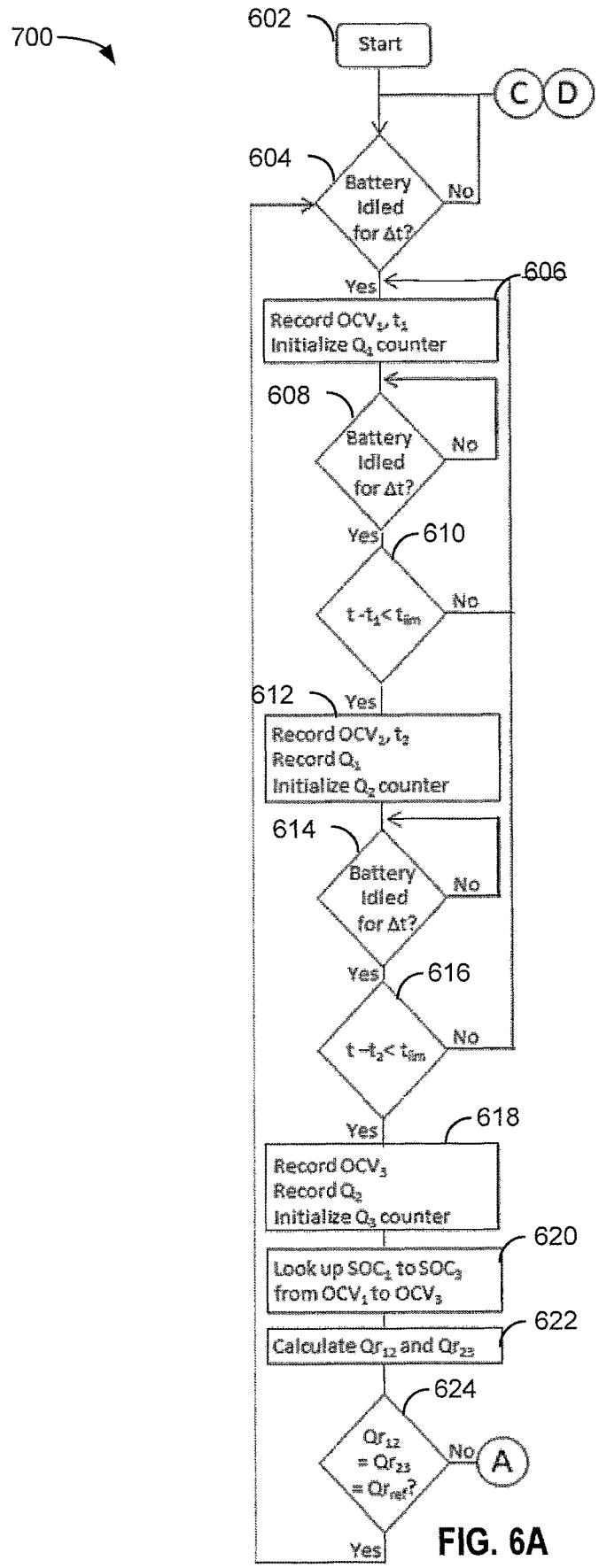
FIGS. 6A-6C illustrate a process flow diagram for diagnosing the battery cell and recalibrating the SOC scale for the battery cell.
Figure 6B:
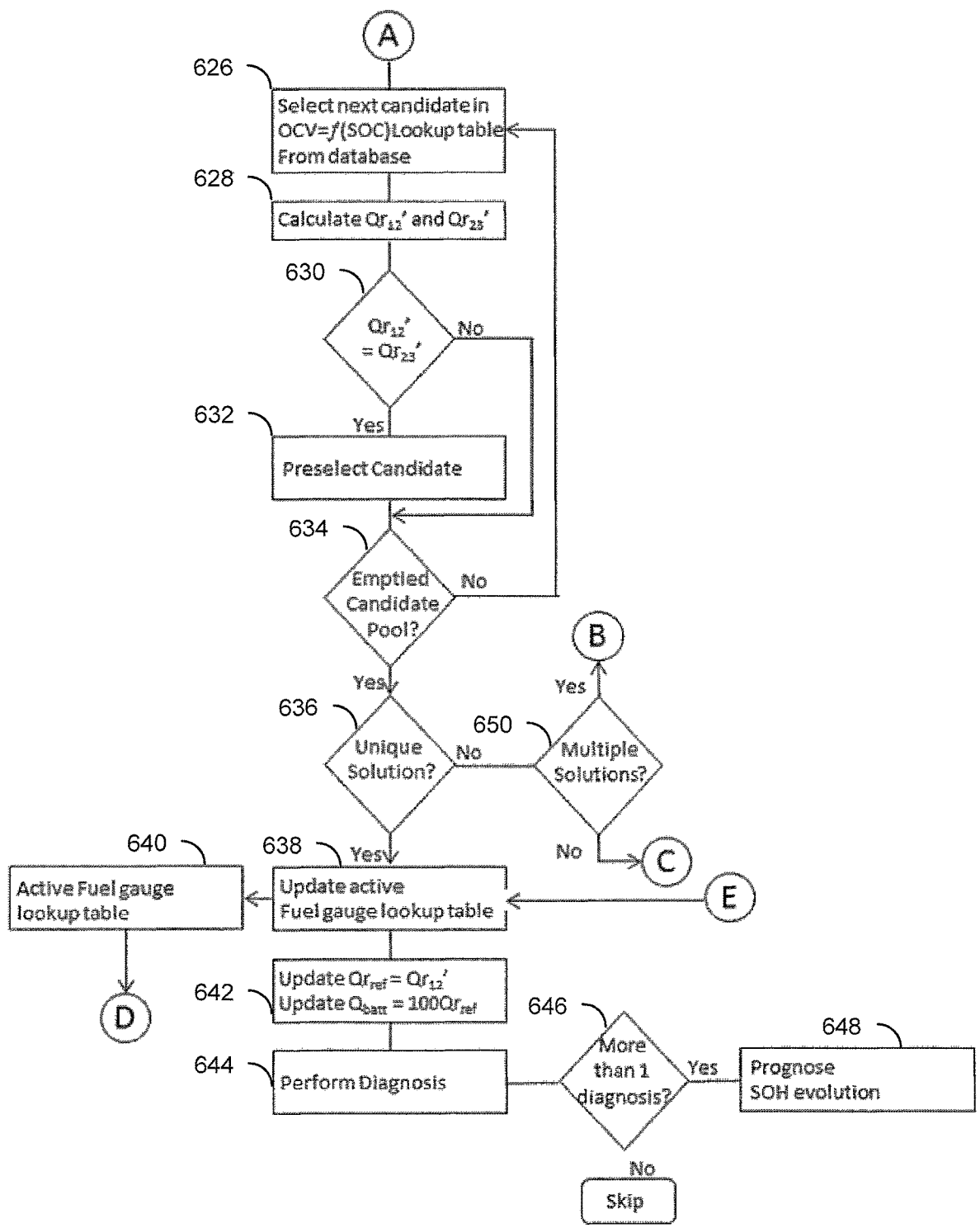
Figure 6C:
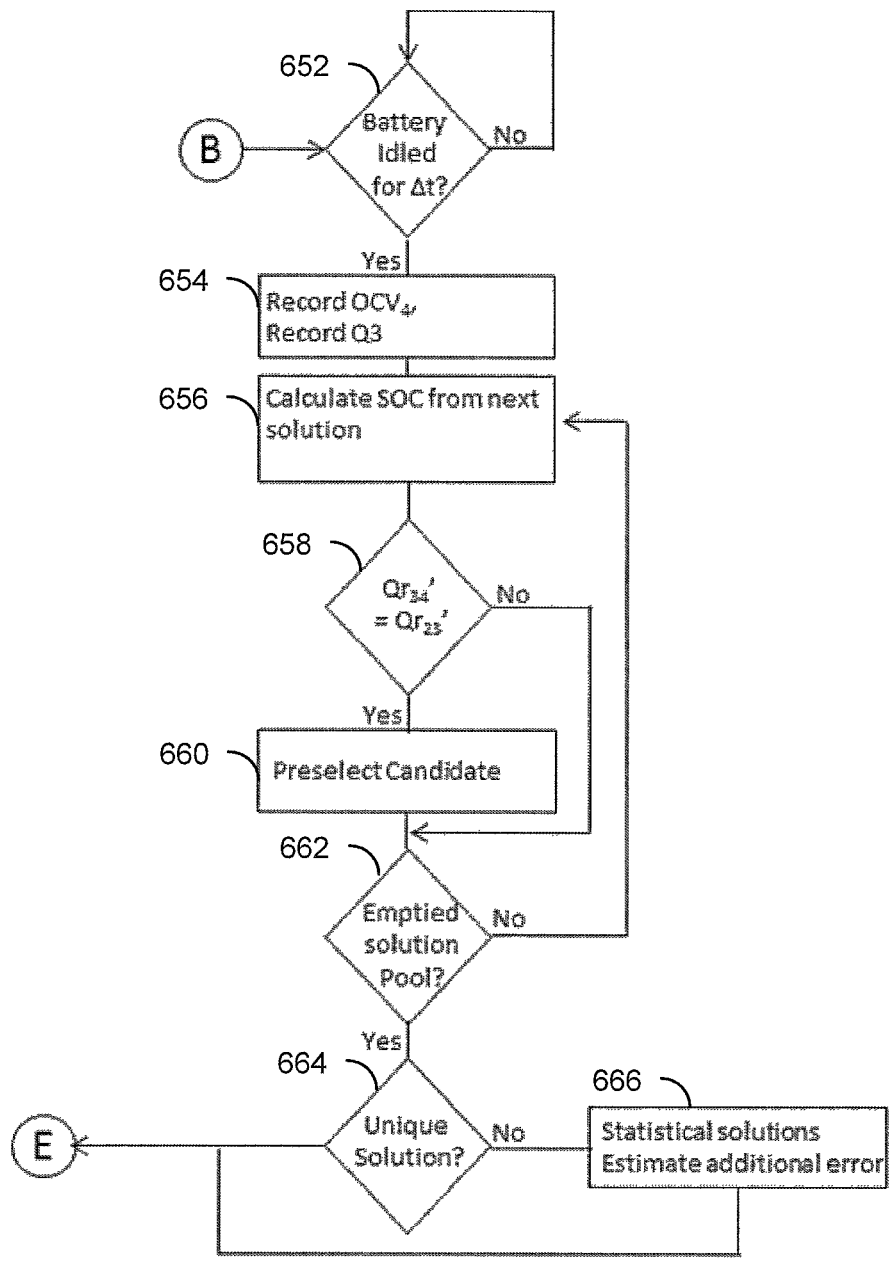

FIGS. 6A-6C illustrate a process 600 flow diagram for diagnosing the battery cell 504a and recalibrating the SOC scale for the battery cell 504a. Various steps of the process 600 may be performed by the BMS 502 illustrated in FIG. 5A or one or more components of the BMS 502. Although the process is described herein with reference to a particular order, in various aspects, blocks herein may be performed in a different order, or omitted, and additional blocks may be added.

With reference to one or more of FIGS. 6A-6C and 5A, at step 602, the process 600 starts and proceeds to step 604, which includes determining whether the battery cell (e.g., the battery cell 504a) has been idle for a sufficient amount of time (e.g., at least a threshold of time $\Delta t$). In some embodiments, the $\Delta t$ may comprise any duration of time, dependent on a chemistry of the battery cell 504a. For example, the $\Delta t$ is, is about, is at least, is at least about, is at most, or is at most about 5 minutes, 10 minutes, 15 minutes, 20 minutes, 25 minutes, 30 minutes, 35 minutes, 40 minutes, 45 minutes, 50 minutes, 55 minutes, 60 minutes, 2 hours, 3 hours, 4 hours, 5 hours, or fractions thereof. In some embodiments, the determination of step 604may be made by the processor 512 in communication with the clock 510 and the voltage sensor 506 and/or the current sensor 508. If the processor 512 determines that the battery cell 504a is idle for a sufficient period of time, the process proceeds to step 606. If the processor 512 determines that the battery cell 504a is not idle for a sufficient period of time, the process repeats step 604until the battery cell 504a is idle for the minimum time.

At step 606, the processor 512 records the current voltage value (e.g., $RCV_1$) of the battery cell 504a via the voltage sensor 506. In some embodiments, the processor 512 also increments the counter 518 regarding the number of RCV values stored or acquired. Once the counter 518 is incremented, the process 600 proceeds to the step 608. At block

608, the processor 512 (again in conjunction with the clock 510 and the voltage sensor 506) determines if the battery cell 504a is again idle for the sufficient period of time. If so, the process 600 proceeds to step 610, where the processor 512 determines if an amount of time between the steps 604 and 608 exceeds a threshold value. For example, the threshold value is, is about, is at least, is at least about, is at most, or is at most about 5 minutes, 10 minutes, 15 minutes, 20 minutes, 25 minutes, 30 minutes, 35 minutes, 40 minutes, 45 minutes, 50 minutes, 55 minutes, 60 minutes, 2 hours, 3 hours, 4 hours, 5 hours, 6 hours, 7 hours, 8 hours, 9 hours, 10 hours, 11 hours, 12 hours, 1 day, 2 days, 3 days, 4 days, 1 week, 2 weeks, 3 weeks, 1 month, 2 months, 3 months, 4 months, 1 year, or fractions thereof. If the processor 512 determines that too much time has passed between the RCV1 and the RCV2 measurements, the processor 512 may discard the RCV1 measurement and replace the RCV1 value with the RCV2 value and remeasure the RCV2 value at a later time, therefore repeating steps 606-610. If the processor 512 determines at step 610 that the amount of time does not exceed the threshold value, then the process proceeds to step 612, where the processor 512 records the second $RCV_2$ value and increments the counter 518 of the number of RCV values. The process 600 then proceeds to steps 614, where the processor 512 repeats the step 604 a third and final time before proceeding to step 616, where the processor 512 repeats the step 606a third and final time, assuming the threshold value has not been exceeded between the second and third measurement times. If the processor 512 determines that too much time has passed between the RCV2 and the RCV3 measurements, the processor 512 may discard both the RCV1 and RCV2 measurements and replace the RCV1 value with the RCV3 value and remeasure both the RCV2 and RCV3 measurements at a later time, therefore repeating steps 606-616. If the processor 512 determines at step 616 that the amount of time does not exceed the threshold value, then the process proceeds to step 618, where the processor 512 records the third $RCV_3$ value and increments the counter 518 of the number of RCV values, before the process 600 proceeds to step 620.

At step 620, the processor 512 identifies the SOC values for each of the $RCV_1$ to $RCV_3$ values obtained in steps 606, 612, and 618 based on the OCV and SOC relationship lookup table in the memory 514. The process 600 then proceeds to block 622, where the processor 512 calculates the battery cell 504a capacity ratios for at least two of the three sets of values based on capacity or change in capacity values (corresponding to the measured RCV values obtained in steps 606, 612, and 618) and the SOC values obtained in step 620. In some embodiments, the capacity ratios may be calculated based on Equation 1 described herein. The process 600 then proceeds to block 624.

At step 624, the processor 512 determines whether the capacity ratios calculated at step 622 are the same as each other and a reference capacity ratio. If the capacity ratios are the same, then the processor 512 determines that the selected, current, or active OCV and SOC relationship (e.g., the selected active fuel gauge lookup table) is accurate for the battery cell 504a and repeats the process 600 from step 602. Accordingly, when the active OCV and SOC relationship is accurate, the fuel gauge lookup table is determined to be accurate.

Accordingly, if the OCV and SOC relationship is determined to be correct at step 624, then no change needs to be made to the OCV and SOC relationship and we can assume that the SOC scale is correct and accurate. The process 600 may repeat because the process 600 (and the corresponding calculations) is opportunistic so that even if nothing changes, the process 600 can be restarted to be always active in the background.

If, at step 624, the processor 512 determines that the calculated capacity ratios are not the same as each other or the reference capacity ratio, the process 600 proceeds to block 626 at A. At block 626, the processor 512 selects another candidate OCV and SOC relationship lookup table, for example, from the memory 514, or builds another candidate OCV and SOC relationship lookup table based on information in the memory 514 or received via communications. Once the new candidate OCV and SOC relationship lookup table is acquired, the process 600 proceeds to block 628. At block 622, the processor 512 calculates the battery cell 504a capacity ratios ($Qr^{r12}{}'$ and $Q_{r23}{}'$) for at least two of the three sets of values based on capacity or change in capacity values (corresponding to the measured RCV values obtained in steps 606, 612, and 618) and SOC values obtained from the candidate OCV and SOC relationship selected in step 626. For example, the $Q_{r12}{}'$ capacity ratio value may be based on the change in capacity between the first and second RCV values and the corresponding SOC values based on the first and second RCV values in the selected candidate OCV and SOC relationship lookup table. Similarly, the $Q_{r23}{}'$ capacity ratio value may be based on the change in capacity between the second and third RCV values and the corresponding SOC values based on the second and third RCV values in the selected candidate OCV and SOC relationship lookup table.

After the revised capacity ratios are calculated, the processor 512 may determine, at step 630, whether the calculated capacity ratios $Q_{r12}{}'$ and $Q_{r23}{}'$ are equal to each other. In some embodiments, the calculated capacity ratios may be considered "equal" if they are within a percentage of each other, for example, within 1% or 5%. If they are, the process 600 proceeds to step 632. At step 632, the processor 512 selects the new candidate OCV and SOC relationship lookup table and proceeds to step 634, where the processor 512 determines if the candidate pool is empty. If the candidate pool is empty, the process 600 proceeds to step 634, where the processor 512 determines if a unique solution was identified. If, at step 634, the processor 512 determines that the candidate pool is not empty, the steps 626-634 are repeated until the candidate pool is empty. Accordingly, the processor 512 determines which OCV and SOC relationships match the measured and calculated values. If the calculated capacity ratios are not equal to each other at step 630, then the process 600 proceeds to step 634. At step 634, the processor 512 determines whether the pool of candidate OCV and SOC relationship lookup tables has been exhausted (e.g., whether there are no more remaining candidate OCV and SOC relationship lookup tables in the memory 514). If the pool of candidate OCV and SOC relationship lookup tables has been exhausted, the process 600 proceeds to block 636. If the pool of candidate OCV and SOC relationship lookup tables has not been exhausted, the process 600 returns to block 626. Once the candidate pool is emptied, every condition may have been tested.

At block 636, the processor 512 determines whether or not a unique solution exists. For example, there might be times where several set of parameters work in the process. This can happen if the RCV are in areas where the voltage did not change much between the different measurement periods. The previous loop of steps 626-634 may select all the possible candidates. If there is only one possible candidate, the process 600 moves along to step 638. However, if more than one possible candidate was identified, the process 600 needs to decipher which one of the possible candidates is the best. Thus, the process 600 may proceed to step 650, where the processor 512 determines if multiple solutions exists, and if so, proceeds to step 652 at B. Steps 652-666 may add additional RCV points (e.g., fourth and/or fifth points, etc.), thus checking additional values to determine which of the multiple possible candidates is the most accurate for the measured values. In some embodiments, the processor 512 may use statistical analysis to identify the most appropriate solution from the multiple preselected candidates, e.g., providing an average of values from all solutions. If the processor 512 determines that a unique solution does exists (either at step 636 or 664), the process 600 proceeds to step 638, e.g., via E. At step 638, the processor 512 updates the active fuel gauge lookup table based on the selected candidate OCV and SOC relationship lookup table. The process 600 then proceeds to step 640, where the processor 512 applies the newly updated active fuel gauge lookup table to lookup the SOC values for the measured first, second and third RCV in step 620 as mentioned above before restarting the process 600 at step 604.

Process 600 may also proceed to step 642 in all instances where the active fuel gauge lookup table is updated. At step 642, the processor 512 updates the capacity ratio reference based on the capacity ratios identified in step 630 and updates the capacity of the battery cell 504a (or any corresponding battery cell 504b-504n, etc.) based on the capacity ratio reference (e.g., capacity of the battery cell 504a may equal 100 times the capacity ratio reference). Once the capacity ratio reference and the capacity of the battery cell 504a are updated, the process 600 proceeds to step 644, where the processor 512 performs a diagnosis of the battery cell 504a as described herein. For example, the processor 512 may diagnose battery cell 504a degradation according to Equations 3-5 described herein. Accordingly, the processor 512 may determine an amount of lost lithium inventory (in a lithium ion battery cell) or loss of active material on one or both of the electrodes due to aging (e.g., in the lithium ion battery cell). In some embodiments, once the diagnosis is completed at step 644, the process 600 proceeds to step 646, where the processor 512 determines if there is more than one diagnosis (e.g., multiple diagnosis periods as discussed above in reference to FIG. 4). If there are multiple diagnoses determined at step 646, then the process 600 proceeds to step 648, where the processor 512 develops a prognosis of the SOH evolution of the battery cell 504a based on the determined diagnoses. Once the prognosis is developed at step 648, the diagnosis and prognosis portion of the process 600 ends. If there is not multiple diagnoses at step 646, then the diagnosis and prognosis portion of the process 600 ends.

At step 650, if multiple solutions are not identified and if no unique solution is identified at step 636, the process 600 may restart at step 604 though C. This may prevent the process 600 from being "locked" or getting "frozen" if no solution is found for existing measurements. Accordingly, the RCV values may be discarded when too much time passes between subsequent measurements and the process 600 will restart with new values.

Figure 7:
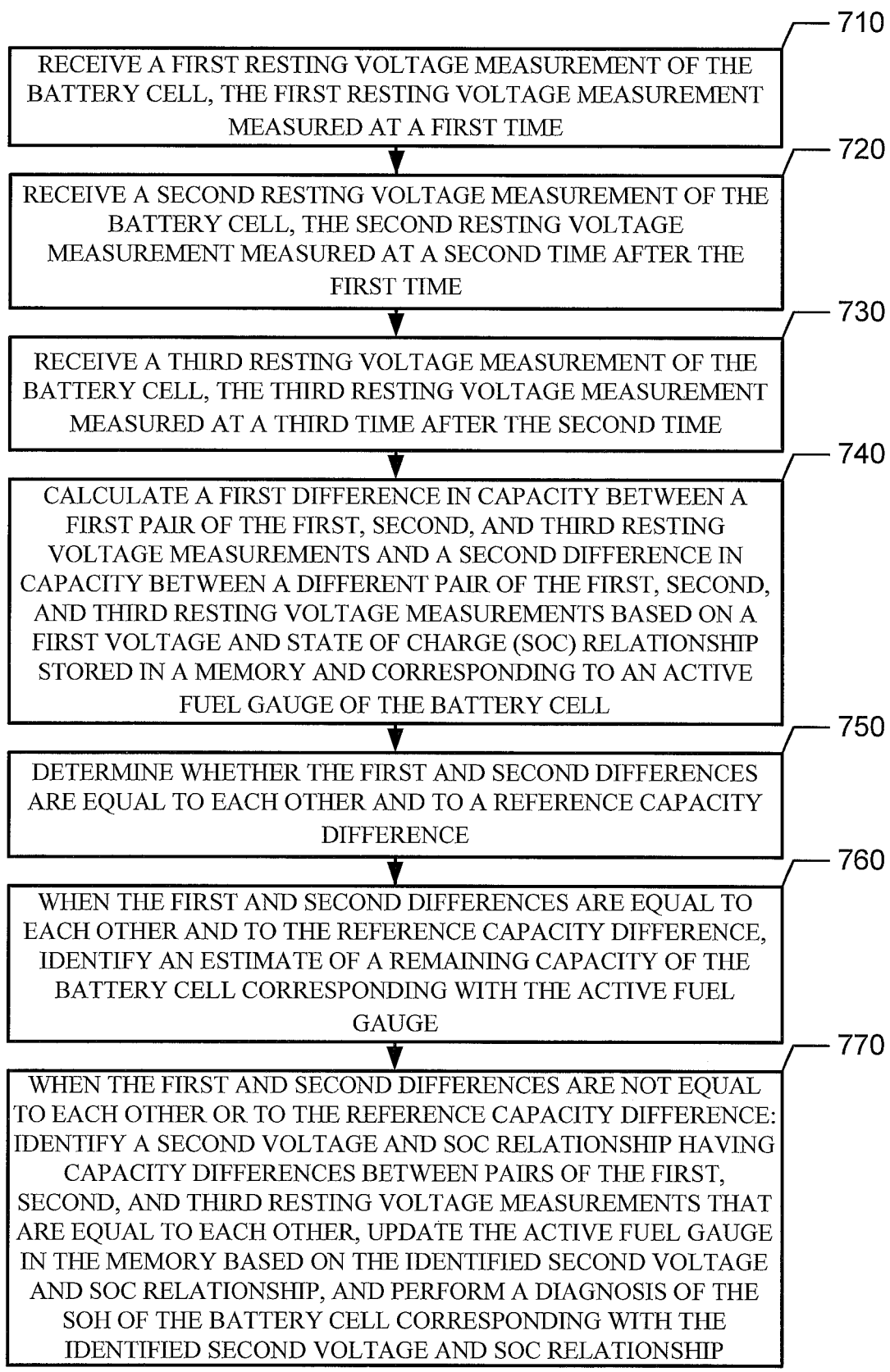
FIG. 7 illustrates a flow chart for a method of various components that may be utilized in a battery management system (BMS) that may be employed as described herein and as discussed in relation to FIGS. 2-4.

FIG. 7 illustrates a flow chart that includes a plurality of steps of a method 700 for estimating an SOH and degradation of a battery cell, in accordance with exemplary embodiments of the present disclosure. For example, the method 700 could be performed by the BMS 502 illustrated in FIG. 5. Method 700 may also be performed by a controller external to the BMS 502 (not shown). A person having ordinary skill in the art will appreciate that the method 700 may be implemented by other suitable devices and systems. Although the method 700 is described herein with reference to a particular order, in various implementations, blocks herein may be performed in a different order, or omitted, and additional blocks may be added.

The method 700 begins at operation block 710 with a processor 512 of the BMS receiving a first resting voltage measurement of the battery cell 504a, the first resting voltage measurement measured at a first time. At operation block 720, the processor 512 of the BMS receives a second resting voltage measurement of the battery cell 504a, the second resting voltage measurement measured at a second time after the first time. At operation block 730, the processor 512 of the BMS 502 receives a third resting voltage measurement of the battery cell 504a, the third resting voltage measurement measured at a third time after the second time.

At operation block 740, the processor 512 calculates a first difference in capacity between a first pair of the first, second, and third resting voltage measurements and a second difference in capacity between a different pair of the first, second, and third resting voltage measurements based on a first voltage and state of charge (SOC) relationship stored in a memory and corresponding to an active fuel gauge of the battery cell 504a.

At operation block 750, the processor determines whether the first and second differences are equal to each other and to a reference capacity difference. When the first and second differences are equal to each other and to the reference capacity difference, at operation block 760, the processor 512 identifies an estimate of a remaining capacity of the battery cell 504a corresponding with the active fuel gauge. When the first and second differences are not equal to each other or to the reference capacity difference, the processor 512 identifies a second voltage and SOC relationship having capacity differences between pairs of the first, second, and third resting voltage measurements that are equal to each other, updates the active fuel gauge in the memory based on the identified second voltage and SOC relationship, and performs a diagnosis of the SOH of the battery cell 504a corresponding with the identified second voltage and SOC relationship.

An apparatus for estimating an SOH and degradation of a battery cell may perform one or more of the functions of method 700, in accordance with certain implementations described herein. The apparatus may comprise means for receiving a first resting voltage measurement of the battery cell 504a. In certain implementations, the means for receiving a first resting voltage measurement can be implemented by the processor 512 or the voltage sensor 506. In some implementations, the means for receiving a first resting voltage measurement can be configured to perform the functions of block 710 of method 700. The apparatus may further comprise means for receiving a second resting voltage measurement of the battery cell 504a. In certain implementations, the means for receiving a second resting voltage measurement can be implemented by the processor 512 or the voltage sensor 506. In some implementations, the means for receiving a second resting voltage measurement can be configured to perform the functions of block 720 of method 700. The apparatus may further comprise means for receiving a third resting voltage measurement of the battery cell 504a. In certain implementations, the means for receiving a third resting voltage measurement can be implemented by the processor 512 or the voltage sensor 506. In some implementations, the means for receiving a third resting voltage measurement can be configured to perform the functions of block 730 of method 700.

The apparatus may further comprise means for calculating a first difference in capacity between pairs of the resting voltage measurements. In certain implementations, the means for calculating can be implemented by the processor 512. In some implementations, the means for calculating can be configured to perform the functions of block 740 of method 700. The apparatus may further comprise means for determining whether differences are equal to each other and to a reference difference. In certain implementations, the means for determining can be implemented by the processor 512. In some implementations, the means for determining can be configured to perform the functions of blocks 750, 760, and 770 of method 700.

Example Use Case

Lithium-ion batteries may be sealed electrochemical energy storage devices consisting of a positive electrode, a negative electrode, a separator and a casing with electrical connections. During operation, lithium ions may be reversibly exchanged between the positive and negative electrodes. Upon assembly, the positive electrode may be the sole source of these lithium ions. This initial inventory of lithium ions may be finite and may not be replenished in typical commercial cells. Lithium ions batteries may exhibit finite calendar and cycle lives typically ranging between 1 to 20 years and 100 to 10,000 cycles depending on the cell design and the operating conditions. Degradation may be continuous from the moment the cells are assembled and can consist of 3 degradation modes: (1) a change in lithium inventory, (2) a change in the amount of active material at either electrode or (3) kinetic hindrance. The present invention may detect and quantify the first 2 modes. A change in lithium inventory may occur when lithium ions are irreversibly consumed by side reactions. A charge cycle may be 99% (or more) reversible. The complement of the reversible charge cycle to 100% may indicate a loss of lithium ions. A change in the amount of active material at either electrode can occur as a result of many underlying mechanisms, such as dissolution, surface passivation, and loss of electronic conductivity or change in the structure.

When either of the first 2 modes is active in the lithium ion cell, a change of the thermodynamic balance may occur with possible outcomes of: (1) capacity fading and (2) modification of the relationship between the OCV and the SOC of the cell. The present invention may detect changes in the OCV and SOC relationship and propose an updated relationship that accounts for these changes in the thermodynamic balance. More specifically, the present invention may offers a way to identify which OCV and SOC relationship is best fitting the current SOH of the cell using the three or more distinct rested cell voltage measurements and two or more variations of charge between these instances of the rested cell.

By periodically updating the OCV and SOC relationship throughout the life of the lithium-ion cell, the evolution of the SOH may be tracked and the OCV and SOC relationship and the thermodynamic capacity $Q_{TH}$ in a battery fuel gauging circuit may be recalibrated. This provides a significant improvement over existing fuel gauge algorithms that typically assume that the OCV and SOC relationship is constant throughout the life of a lithium-ion cell.

Figure 8:
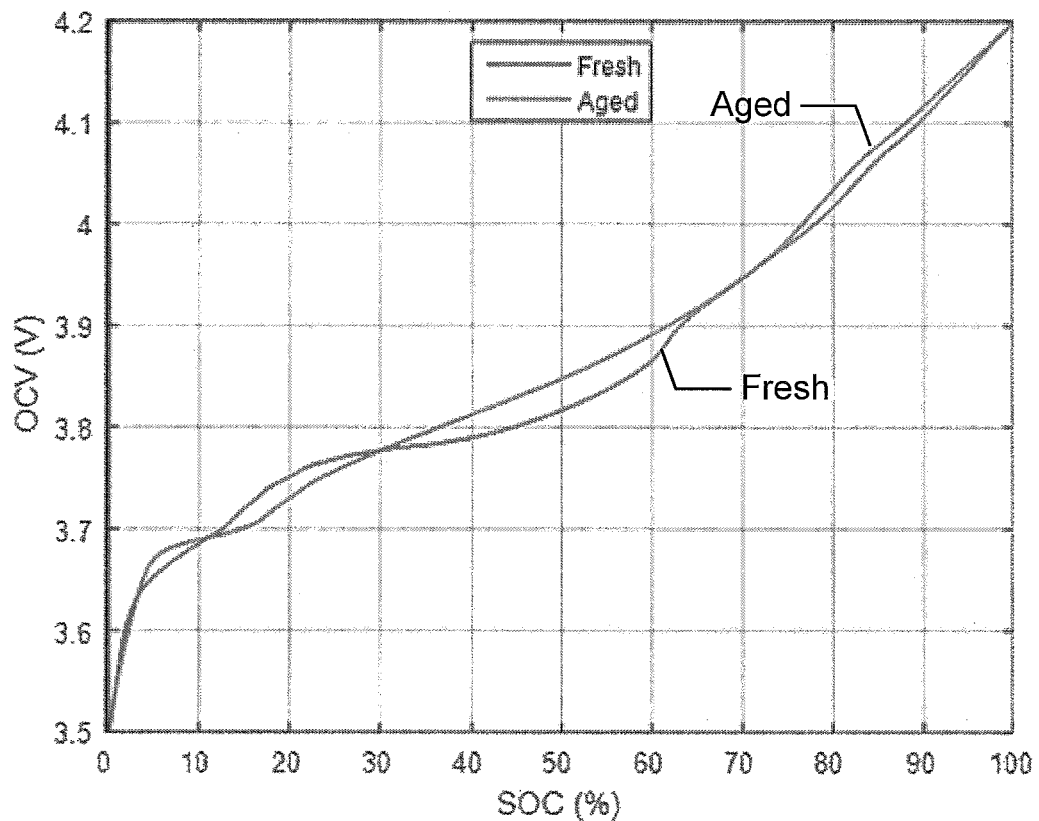
FIG. 8 is an illustration of variations in the OCV and SOC relationship when a cell degrades (e.g., comparing fresh and aged cell OCVs).

FIG. 8 is an illustration of variations in the OCV and SOC relationship when a cell degrades (e.g., comparing fresh and aged cell OCVs). For example, the lithium ion cell may be an LG CChem, Model ICR 18650 C2 (2800 mAh). The OCV curves shown were obtained between 3.5 and 4.2V using a potentiostatic intermittent titration technique (PITT) on a fresh cell which had not cycled and on an aged cell which had cycled more than a 1000 cycles. Based on these measurements, the OCV and SOC relationship is seen to be evolving with the SOH of the cell and cannot be considered constant.

Figure 9:
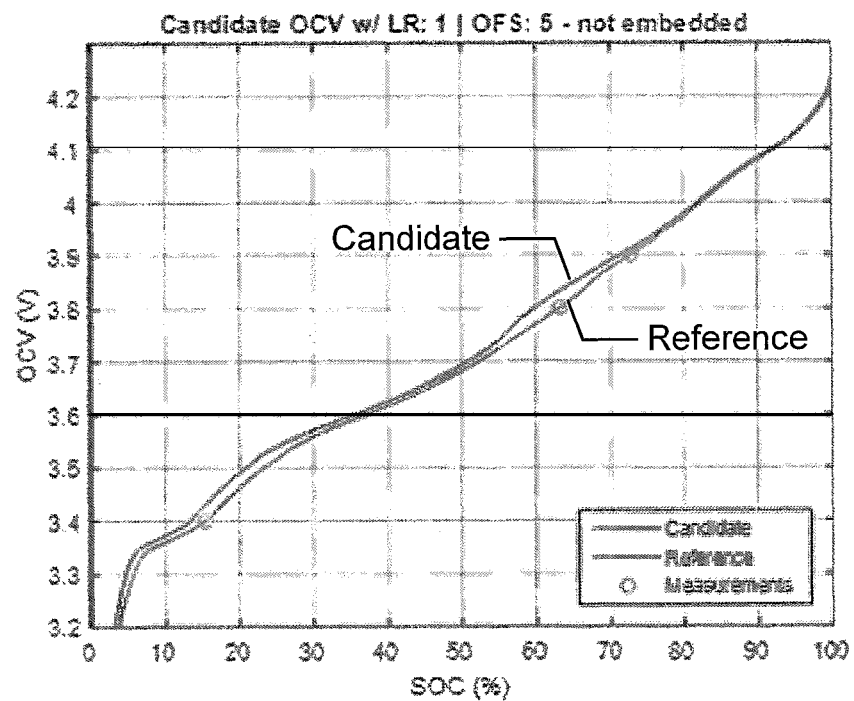
FIG. 9 provides an example of a poor candidate OCV and SOC relationship.

FIG. 9 provides an example of a poor candidate OCV and SOC relationship. In this example of the present invention, a candidate OCV and SOC relationship corresponding to a cell with a loading ratio of 1.0 and an offset of 5% is presented. Measurements shown correspond to a cell with a loading ratio of 1.2 and an offset of 3%. Rested cell voltages (RCVs) are 3.4, 3.8 and 3.9 V.

Figure 10:
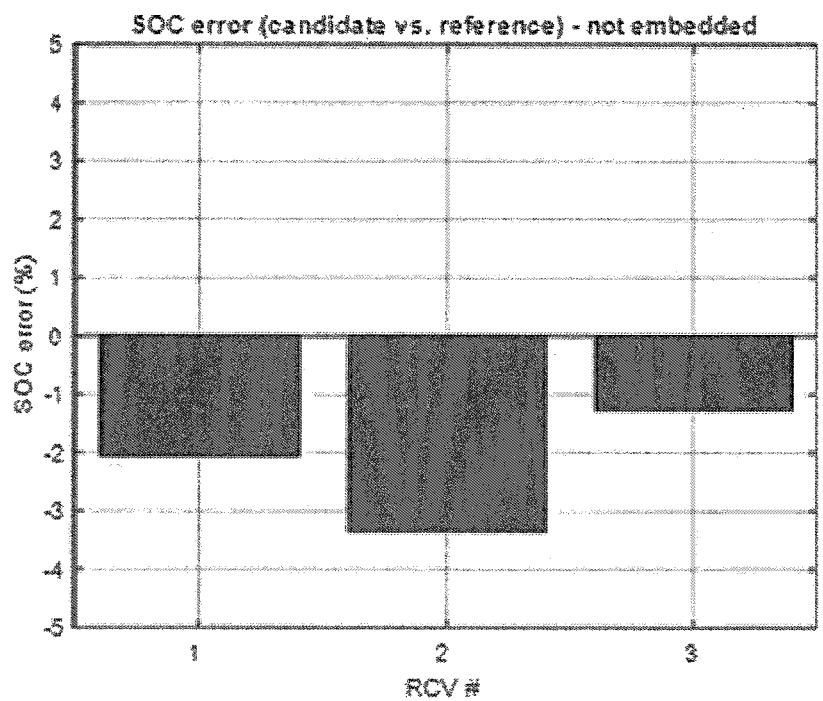
FIG. 10 compares SOC errors at each of the measurements of FIG. 9.

As shown in FIG. 10, which compares SOC errors at each of the measurements of FIG. 9, when the candidate OCV is applied to estimate the SOC corresponding to each of these RCVs, an estimation error is observed: 2% at 3.4V, 3% at 3.8V and 1% at 3.9V.

Figure 11:
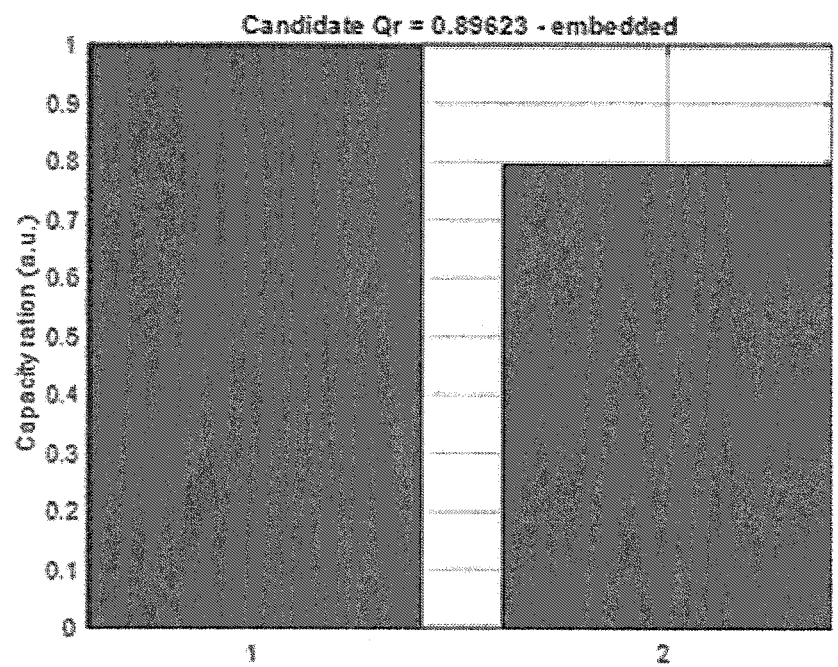
FIG. 11 compares the Qr values between pairs of the RCVs of FIG. 9.

As shown in FIG. 11, which compares the Qr values between pairs of the RCVs of FIG. 9, because of these errors, the two distinct capacity rations calculated between RCV1 and RCV2 on the one hand and RCV2 and RCV3 on the other hand are not equal. This inequality indicates that the candidate OCV is not a good fit for the measurements taken on that cell at this given SOH. In that particular case, Qr12 equals 1 while Qr23 equals 0.8, which means that the actual thermodynamic capacity is unknown.

Figure 12:
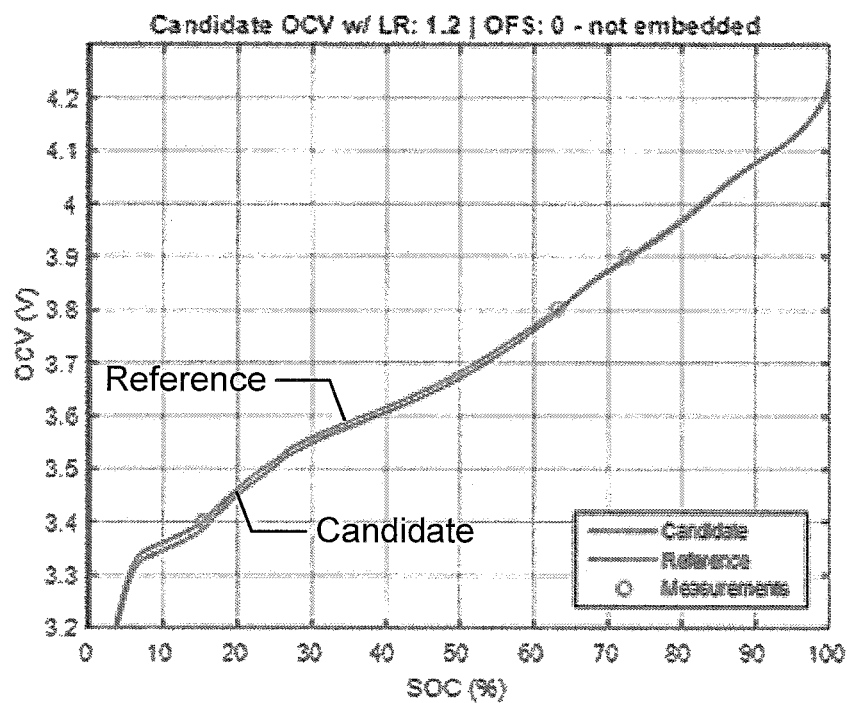
FIG. 12 shows an example of a close fit candidate OCV and SOC relationship.

FIG. 12 shows an example of a close fit candidate OCV and SOC relationship. In this example of the present invention, a candidate OCV and SOC relationship corresponding to a cell with a loading ratio of 1.2 and an offset of 0% is presented. Measurements may correspond to a cell with a loading ratio of 1.2 and an offset of 3%. Rested cell voltages may be 3.4, 3.8 and 3.9 V.

Figure 13:
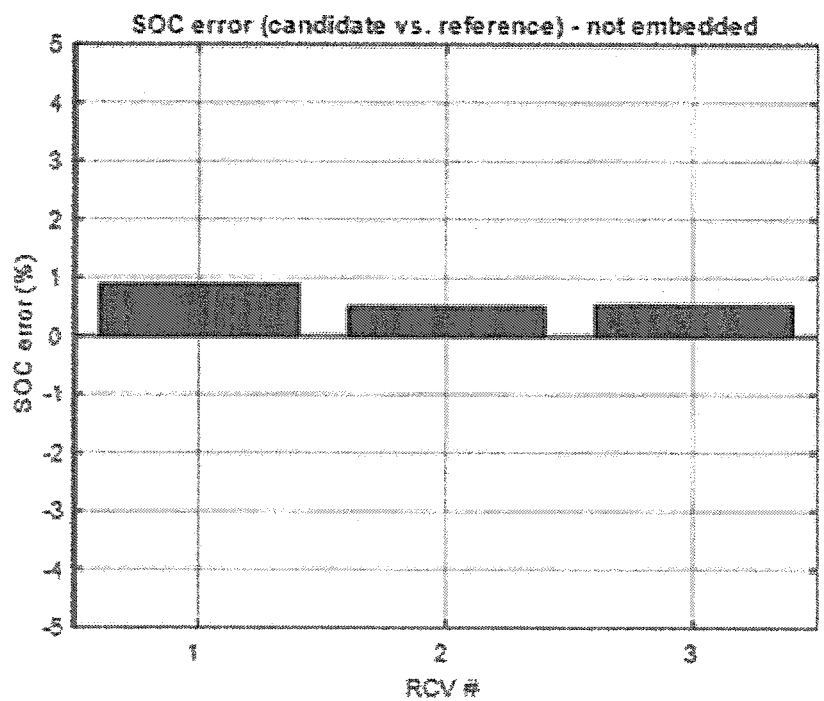
FIG. 13 compares SOC errors at each of the measurements of FIG. 12.

As shown in FIG. 13, which compares SOC errors at each of the measurements of FIG. 12, when the candidate OCV and SOC relationship is applied to estimate the SOC corresponding to each of these RCV, an estimation error is observed: 1% at 3.4V, 0.5% at 3.8V and 3.9V.

Figure 14:
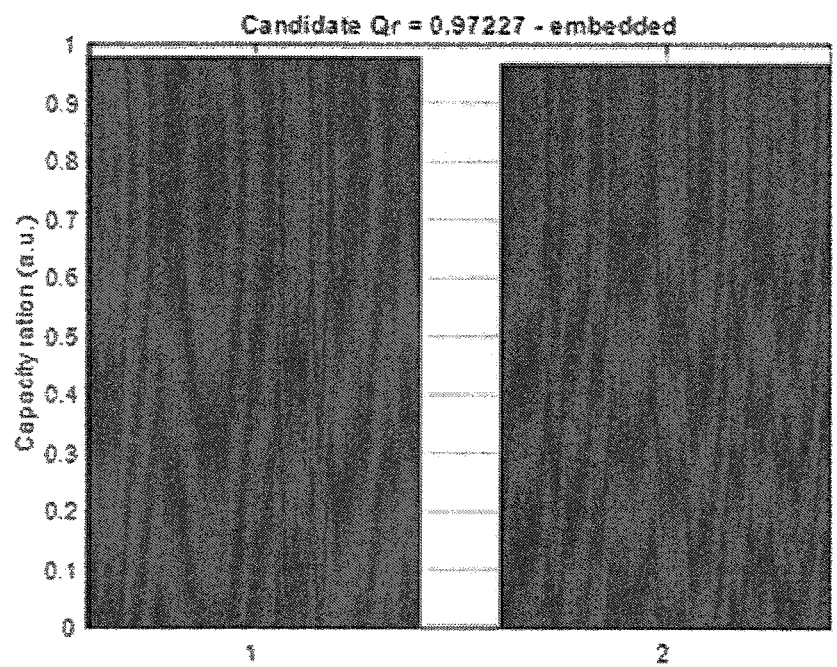
FIG. 14 compares the Qr values between pairs of the RCVs of FIG. 12.

As shown in FIG. 14, which compares the Qr values between pairs of the RCVs of FIG. 12, because of these errors, the two distinct capacity rations calculated between RCV1 and RCV2 on the one hand and RCV2 and RCV3 on the other hand are not strictly equal. This close inequality indicates that the candidate OCV is a decent but imperfect fit for the measurements taken on that cell at this given SOH. In that particular case, Qr12 equals 0.978 while Qr23 equals 0.966, which means that the actual thermodynamic capacity is in that neighborhood.

Figure 15:
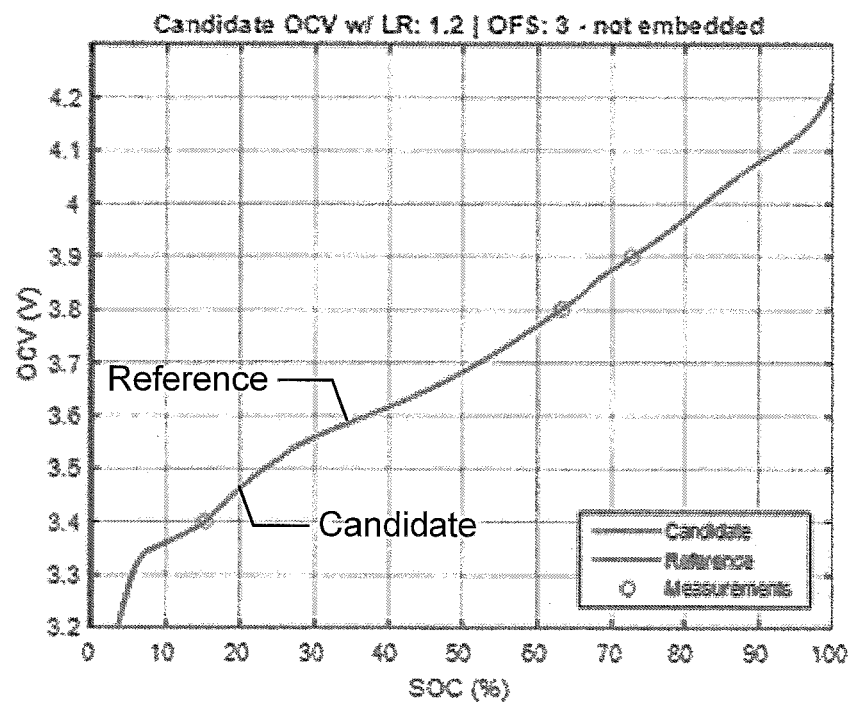
FIG. 15 shows an example of a perfect fit candidate OCV and SOC relationship.

FIG. 15 shows an example of a perfect fit candidate OCV and SOC relationship. In this example of the present invention, a candidate OCV and SOC relationship corresponding to a cell with a loading ratio of 1.2 and an offset of 3% is presented. Measurements may correspond to a cell with a loading ratio of 1.2 and an offset of 3%. Rested cell voltages may be 3.4, 3.8 and 3.9 V.

Figure 16:
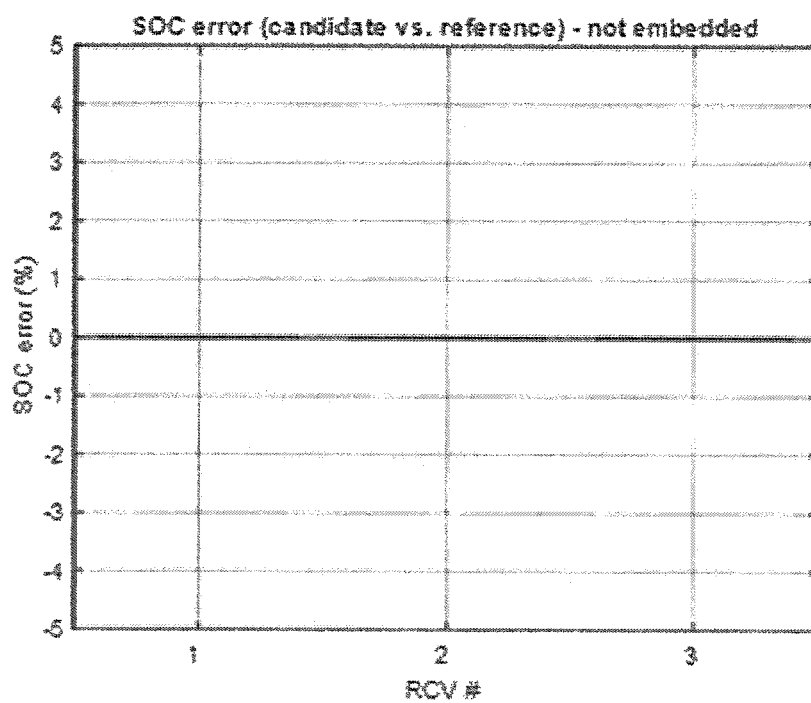
FIG. 16 compares SOC errors at each of the measurements of FIG. 15.

As shown in FIG. 16, which compares SOC errors at each of the measurements of FIG. 15, when the candidate OCV and SOC relationship is applied to estimate the SOC corresponding to each of these RCV, no estimation error is observed: 0% at 3.4V, 3.8V and 3.9V.

Figure 17:
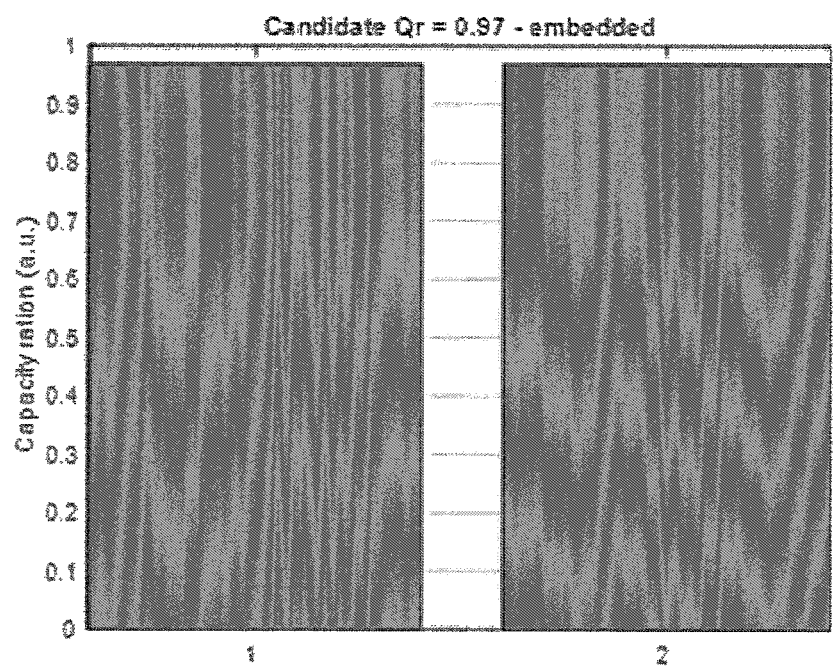
FIG. 17 compares the Qr values between pairs of the RCVs of FIG. 15.

As shown in FIG. 17, which compares the Qr values between pairs of the RCVs of FIG. 15, because the candidate OCV and SOC relationship happens to be the actual OCV for this cell at this particular SOH (LR:1.2, OFS:3%), the two distinct capacity rations calculated between RCV1 and RCV2 on the one hand and RCV2 and RCV3 on the other hand are strictly equal. This equality indicates that the candidate OCV is a perfect fit for the measurements taken on that cell at this given SOH. In that particular case, Qr12 equals Qr23 equals 0.97, which means that the actual thermodynamic capacity is in now known to be 0.97.

Figure 18A:
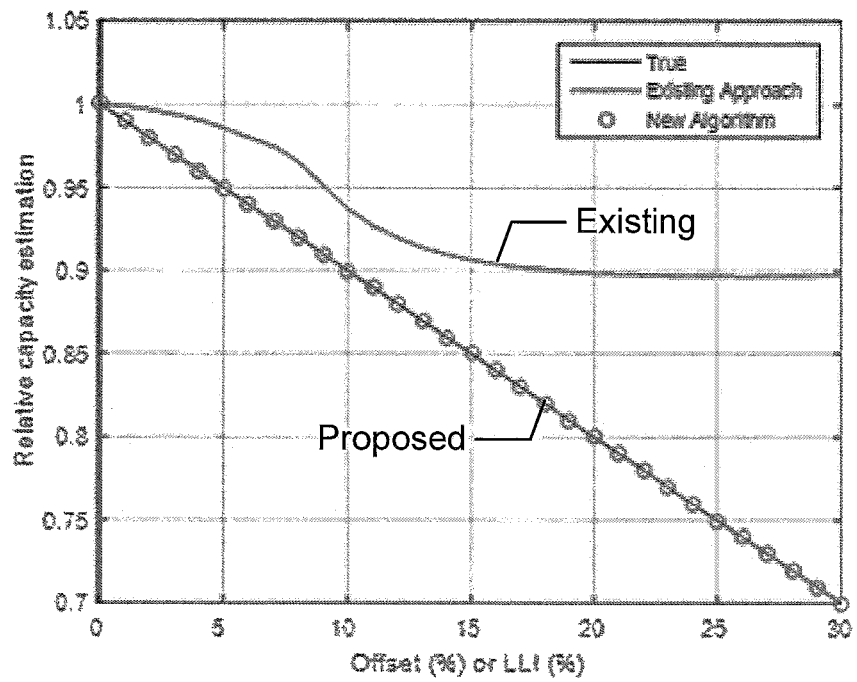
FIG. 18A shows a comparison of the SOH estimation with (proposed) and without (existing) OCV and SOC relationship recalibration.
Figure 18B:
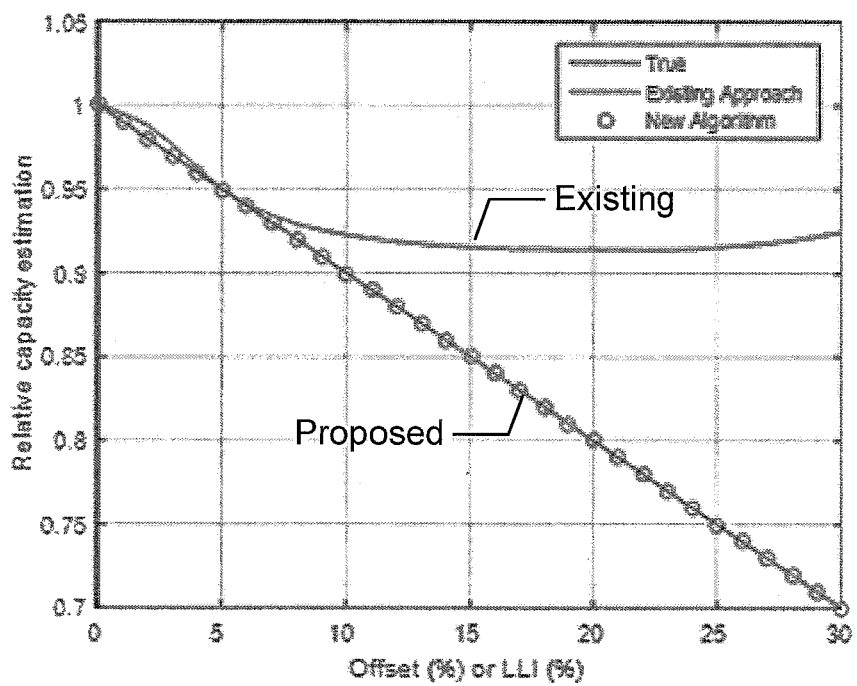
FIG. 18B shows a comparison similar to FIG. 18B, but with different RCVs.

FIG. 18A shows a comparison of the SOH estimation with (proposed) and without (existing) OCV and SOC relationship recalibration, according to the present invention as described herein. FIG. 18B shows a comparison of the SOH estimation with (proposed) and without (existing) OCV and SOC relationship recalibration with different RCVs, according to the present invention as described herein. The practical consequences of considering this relationship constant are simulated in the FIGS. 18A and 18B, where the existing approach measures the capacity exchanged between two rested cell voltages and translates these rested cell voltages into states of charge using the OCV and SOC relationship of a fresh cell whatever the extent of the degradation might be (e.g. loss of lithium inventory up to 30%). As a result, the estimate for the maximum capacity derived from the capacity ration formula will be inaccurate, either immediately, as in Graph 11 or after a small amount of degradation, as in Graph 12. The present invention, on the other hand, is able to accurately report the maximum capacity by using the same capacity ration formula but with an updated OCV and SOC relationship previously identified. [0101] As used herein, the term "determining" and/or "identifying" encompass a wide variety of actions. For example, "determining" and/or "identifying" may include calculating, computing, processing, deriving, choosing, investigating, looking up (e.g., looking up in a table, a database or another data structure), ascertaining and the like. Also, "determining" may include receiving (e.g., receiving information), accessing (e.g., accessing data in a memory) and the like. Also, "determining" may include resolving, identifying, establishing, selecting, choosing, determining and the like. Further, a "channel width" as used herein may encompass or may also be referred to as a bandwidth in certain aspects.

As used herein, a phrase referring to "at least one of" a list of items refers to any combination of those items, including single members. As an example, "at least one of: a, b, or c" is intended to cover: a, b, c, a-b, a-c, b-c, and a-b-c.

The various operations of methods described above may be performed by any suitable means capable of performing the operations, such as various hardware and/or software component(s), circuits, and/or module(s). Generally, any operations illustrated in the figures may be performed by corresponding functional means capable of performing the operations.

As used herein, the term interface may refer to hardware or software configured to connect two or more devices together. For example, an interface may be a part of a processor or a bus and may be configured to allow communication of information or data between the devices. The interface may be integrated into a chip or other device. For example, in some embodiments, an interface may comprise a receiver configured to receive information or communications from a device at another device. The interface (e.g., of a processor or a bus) may receive information or data processed by a front end or another device or may process information received. In some embodiments, an interface may comprise a transmitter configured to transmit or communicate information or data to another device. Thus, the interface may transmit information or data or may prepare information or data for outputting for transmission (e.g., via a bus).

The various illustrative logical blocks, modules and circuits described in connection with the present disclosure may be implemented or performed with a general purpose processor, a digital signal processor (DSP), an application specific integrated circuit (ASIC), a field programmable gate array (FPGA) signal or other programmable logic device (PLD), discrete gate or transistor logic, discrete hardware components or any combination thereof designed to perform the functions described herein. A general purpose processor may be a microprocessor, but in the alternative, the processor may be any commercially available processor, controller, microcontroller or state machine. A processor may also be implemented as a combination of computing devices, e.g., a combination of a DSP and a microprocessor, a plurality of microprocessors, one or more microprocessors in conjunction with a DSP core, or any other such configuration.

In one or more aspects, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk, and Blu-ray® disc where disks usually reproduce data magnetically, while discs reproduce data optically with lasers. Thus, in some aspects, computer readable medium may comprise non-transitory computer readable medium (e.g., tangible media). In addition, in some aspects computer readable medium may comprise transitory computer readable medium (e.g., a signal). Combinations of the above should also be included within the scope of computer-readable media.

Thus, certain aspects may comprise a computer program product for performing the operations presented herein. For example, such a computer program product may comprise a computer readable medium having instructions stored (and/or encoded) thereon, the instructions being executable by one or more processors to perform the operations described herein. For certain aspects, the computer program product may include packaging material.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

Software or instructions may also be transmitted over a transmission medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of transmission medium.

It is to be understood that the claims are not limited to the precise configuration and components illustrated above. Various modifications, changes and variations may be made in the arrangement, operation and details of the methods and apparatus described above without departing from the scope of the claims.

While the foregoing is directed to aspects of the present disclosure, other and further aspects of the disclosure may be devised without departing from the basic scope thereof, and the scope thereof is determined by the claims that follow.

What is claimed is:

1. An apparatus for updating an active fuel gauge of an energy storage cell, the apparatus comprising:
   a memory configured to store data regarding the active fuel gauge of the energy storage cell based on a first voltage and state of charge (SOC) relationship;
   a sensor configured to measure a voltage of the energy storage cell; and
   a processor configured to:
     receive a first resting voltage measurement of the energy storage cell from the sensor, the first resting voltage measurement measured at a first time,
     receive a second resting voltage measurement of the energy storage cell from the sensor, the second resting voltage measurement measured at a second time after the first time,
     receive a third resting voltage measurement of the energy storage cell from the sensor, the third resting voltage measurement measured at a third time after the second time,
     calculate a first difference in capacity between a first pair of the first, second, and third resting voltage measurements,
     and a second difference in capacity between a different pair of the first, second, and third resting voltage measurements based on the first voltage and SOC relationship,
     determine whether the first difference and the second difference are equal to a reference capacity difference, and
     based on the first and second differences not being equal to the reference capacity difference:
       based at least on cell modeling, calculate a second voltage and SOC relationship having capacity differences between pairs of the first, second, and third resting voltage measurements that are equal to each other, the cell modeling based on data relating to a half-cell, the data relating to the half-cell based on electrochemical performance of each electrode of the energy storage cell with a reference electrolyte, and
       update the active fuel gauge based on the second voltage and SOC relationship.

2. The apparatus of claim 1, wherein the second resting voltage measurement is received within a first threshold time of the first resting voltage measurement and the third resting voltage measurement is received within a second threshold time of the second resting voltage measurement and wherein the first threshold time is equal to the second threshold time.

3. The apparatus of claim 2, wherein the processor is further configured to discard the first resting voltage measurement when the first threshold time is exceeded and discard the second resting voltage measurement when the second threshold time is exceeded.

4. The apparatus of claim 1, wherein the processor is further configured to:
   record the first, second, and third resting voltage measurements in the memory; and
   identify and record in the memory a discharged capacity of the energy storage cell at each of the second resting voltage measurement and the third resting voltage measurement,
   wherein the first and second differences are based on the discharged capacity of the energy storage cell at each of the second and third resting voltage measurements and SOC percentages based on the first, second, and third resting voltage measurements.

5. The apparatus of claim 1, wherein the processor configured to calculate the second voltage and SOC relationship comprises the processor configured to:
   identify a unique voltage and SOC relationship as the second voltage and SOC relationship based on at least one additional resting voltage measurement of the energy storage cell, or
   select the second voltage and SOC relationship from a set of candidate voltage and SOC relationships based on statistical analysis.

6. The apparatus of claim 5, wherein the processor configured to select the second voltage and SOC relationship from the set of voltage and SOC relationships comprises the processor configured to:
   identify the set of candidate voltage and SOC relationships from a plurality of voltage and SOC relationships having capacity differences between pairs of the first, second, and third resting voltage measurements that are equal to each other based on the first, second, and third resting voltage measurements, and
   identify the second voltage and SOC relationship from the set of candidate voltage and SOC relationships based on the statistical analysis.

7. The apparatus of claim 1, wherein the processor is further configured to perform a diagnosis of a state-of-health (SOH) of the energy storage cell.

8. The apparatus of claim 1, wherein the processor is further configured to discard the first, second, and third resting voltage measurements and receive replacement first, second, and third resting voltage measurements when no second voltage and SOC relationship is identified by the processor.

9. The apparatus of claim 1, wherein the processor configured to determine whether the first and second differences are equal to each other and to a reference capacity difference comprises the processor configured to determine whether the first and second differences are within a defined percentage of each other or of the reference capacity difference, wherein:
   when the first and second differences are within the defined percentage of each other and of the reference capacity difference, the processor is configured to identify an estimate of a remaining capacity of the energy storage cell corresponding with on the active fuel gauge, and
   when the first and second differences are not within the defined percentage of each other or of the reference capacity difference, the processor is configured to:
     identify a second voltage and SOC relationship having capacity differences between pairs of the first, second, and third resting voltage measurements that are equal to each other, and update the active fuel gauge based on the identified second voltage and SOC relationship.

10. An energy storage system comprising the apparatus of claim 1 and an energy storage cell.

11. The apparatus of claim 1, wherein the processor is further configured to:
   determine an amount of loss of lithium inventory and loss of active material of one or both electrodes of the energy storage cell, and
   develop a prognosis of a SOH evolution of the energy storage cell.

12. A method of updating an active fuel gauge of an energy storage cell, the method comprising:
   receiving a first resting voltage measurement of the energy storage cell, the first resting voltage measurement measured at a first time,
   receiving a second resting voltage measurement of the energy storage cell, the second resting voltage measurement measured at a second time after the first time,
   receiving a third resting voltage measurement of the energy storage cell, the third resting voltage measurement measured at a third time after the second time,
   calculating a first difference in capacity between a first pair of the first, second, and third resting voltage measurements
   and a second difference in capacity between a different pair of the first, second, and third resting voltage measurements based on a first voltage and state of charge (SOC) relationship stored in a memory and corresponding to the active fuel gauge of the energy storage cell,
   determining whether the first difference and the second difference are equal to a reference capacity difference, and
   based on the first and second differences not being equal to the reference capacity difference:
      based at least on cell modeling, calculating a second voltage and SOC relationship having capacity differences between pairs of the first, second, and third resting voltage measurements that are equal to each other, the cell modeling based on data relating to a half-cell, the data relating to the half-cell based on electrochemical performance of each electrode of the energy storage cell with a reference electrolyte, and
      updating the active fuel gauge in the memory based on the second voltage and SOC relationship.

13. The method of claim 12, wherein the second resting voltage measurement is received within a first threshold time of the first resting voltage measurement and the third resting voltage measurement is received within a second threshold time of the second resting voltage measurement and wherein the first threshold time is equal to the second threshold time.

14. The method of claim 13, further comprising:
   discarding the first resting voltage measurement when the first threshold time is exceeded, and
   discarding the second resting voltage measurement when the second threshold time is exceeded.

15. The method of claim 12, further comprising:
   recording the first, second, and third resting voltage measurements in the memory; and
   recording a discharged capacity of the energy storage cell at each of the second resting voltage measurement and the third resting voltage measurement,
   wherein the first and second differences are based on the discharged capacity of the energy storage cell at each of the second resting voltage measurement and the third resting voltage measurement and SOC percentages based on the first, second, and third resting voltage measurements.

16. The method of claim 12, wherein calculating the second voltage and SOC relationship comprises:
   identifying a unique voltage and SOC relationship as the second voltage and SOC relationship based on at least one additional resting voltage measurement of the energy storage cell, or
   selecting the second voltage and SOC relationship from a set of candidate voltage and SOC relationships based on statistical analysis.

17. The method of claim 16, wherein selecting the second voltage and SOC relationship from the set of voltage and SOC relationships comprises:
   identifying the set of candidate voltage and SOC relationships from a plurality of voltage and SOC relationship having capacity differences between pairs of the first, second, and third resting voltage measurements that are equal to each other based on the received first, second, and third resting voltage measurements, and
   identifying the second voltage and SOC relationship from the set of candidate voltage and SOC relationships based on the statistical analysis.

18. The method of claim 12, further comprising performing a plurality of diagnoses of a SOH of the energy storage cell, and performing a prognosis of an evolution of the SOH of the energy storage cell based on the plurality of diagnoses of the SOH of the energy storage cell.

19. The method of claim 12, further comprising:
   discarding the first, second, and third received resting voltage measurements, and
   receiving replacement first, second, and third resting voltage measurements when no second voltage and SOC relationship is identified by the processor.

20. The method of claim 12, wherein determining whether the first and second differences are equal to each other and to a reference capacity difference comprises:
   determining whether the first and second differences are within a defined percentage of each other or of the reference capacity difference, and wherein
   when the first and second differences are within the defined percentage of each other and of the reference capacity difference, identifying an estimate of a remaining capacity of the energy storage cell corresponding with on the active fuel gauge, or
   when the first and second differences are not within the defined percentage of each other or of the reference capacity difference:
      identifying a second voltage and SOC relationship having capacity differences between pairs of the first, second, and third resting voltage measurements that are equal to each other, and
      updating the active fuel gauge based on the identified second voltage and SOC relationship.

21. An apparatus for estimating a state-of-health (SOH) of a battery cell, the apparatus comprising:
   a memory configured to store data regarding the active fuel gauge of the battery cell based on a first voltage and state of charge (SOC) relationship;
   a sensor configured to measure a voltage of the battery cell;
   a processor configured to:
   receive a first resting voltage measurement of the battery cell from the sensor, the first resting voltage measurement measured at a first time, receive a second resting voltage measurement of the battery cell from the sensor, the second resting voltage measurement measured at a second time after the first time, receive a third resting voltage measurement of the battery cell from the sensor, the third resting voltage measurement measured at a third time after the second time, calculate a first difference in capacity between a first pair of the first, second, and third resting voltage measurements and a second difference in capacity between a different pair of the first, second, and third resting voltage measurements based on the first voltage and SOC relationship, determine whether the first difference and the second difference are equal to a reference capacity difference, and based on the first and second differences not being equal to the reference capacity difference:
  based at least on cell modeling, calculate a second voltage and SOC relationship having capacity differences between pairs of the first, second, and third resting voltage measurements that are equal to each other, the cell modeling based on data relating to a half-cell, the data relating to the half-cell based on electrochemical performance of each electrode of the battery cell with a reference electrolyte,
  update the active fuel gauge based on the second voltage and SOC relationship, and
  perform a diagnosis of the SOH of the battery cell corresponding with the identified second voltage and SOC relationship.

* * * * *

UNITED STATES PATENT AND TRADEMARK OFFICE
CERTIFICATE OF CORRECTION

| | |
|---|---|
| PATENT NO. | : 11,415,630 B2 |
| APPLICATION NO. | : 15/444163 |
| DATED | : August 16, 2022 |
| INVENTOR(S) | : Matthieu Dubarry |

It is certified that error appears in the above-identified patent and that said Letters Patent is hereby corrected as shown below:

On the Title Page

On Page 2, Item (56) Column 2 at Line 3, Delete "//graphlte" and insert -- /graphite --.

In the Specification

In Column 1 at Line 50-61, delete "UH-1078 PATENT that supplies electricity to homes, business, etc. (e.g., performing frequency regulation, renewable energy storage, emergency storage, etc.). In most instances, a battery module or system is comprised of one or more electrochemical device(s) (i.e., the cell(s) or battery(ies)) and an electronic circuit that interfaces with the cell(s) and a load that the cell(s) powers. This electronic circuit may feature one or both of a charger integrated circuit (IC) and a fuel gauge IC. The charger IC may coordinate charging of the cell(s) while the fuel gauge IC may determine an amount of fuel in the cell(s) or the SOC of the cell(s)." and insert the same on Column 1, Line 49, as a continuation of the same paragraph.

In Column 1 at Line 50, Before "that" delete "UH-1078 PATENT".

In Column 12 at Line 1, delete "$ASOC_{12}$," and insert -- $\Delta SOC_{12}$, --.

In Column 12 at Line 3, delete "$ASOC_{23}$" and insert -- $\Delta SOC_{23}$, --.

In Column 12 at Line 5 (Approx.), delete "$ASOC_{13}$" and insert -- $\Delta SOC_{13}$, --.

In Column 12 at Line 18 (Approx.), delete "ASOC" and insert -- $\Delta SOC$ --.

In Column 12 at Line 25 (Approx.), delete "ASOC" and insert -- $\Delta SOC$ --.

In Column 18 at Line 53, delete "604may" and insert -- 604 may --.

In Column 18 at Line 60, delete "604until" and insert -- 604 until --.

Signed and Sealed this
Thirty-first Day of January, 2023

*Katherine Kelly Vidal*

Katherine Kelly Vidal
*Director of the United States Patent and Trademark Office*

CERTIFICATE OF CORRECTION (continued)
U.S. Pat. No. 11,415,630 B2

In Column 20 at Line 15, delete "$(Qr^{r12}$" and insert -- $(Q_{r12}'$ --.

In the Claims

In Column 27 at Line 38, In Claim 1, delete "measurements," and insert -- measurements --.